(12) United States Patent
Toya et al.

(10) Patent No.: US 9,923,107 B2
(45) Date of Patent: *Mar. 20, 2018

(54) PHOTOVOLTAIC MODULE, PHOTOVOLTAIC APPARATUS, AND METHOD FOR PRODUCING PHOTOVOLTAIC MODULE

(71) Applicant: Sumitomo Electric Industries, Ltd., Osaka-shi (JP)

(72) Inventors: Kazumasa Toya, Osaka (JP); Takashi Iwasaki, Osaka (JP); Youichi Nagai, Osaka (JP); Koji Mori, Osaka (JP); Kenji Saito, Osaka (JP); Rui Mikami, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 20 days.

This patent is subject to a terminal disclaimer.

(21) Appl. No.: 14/795,653

(22) Filed: Jul. 9, 2015

(65) Prior Publication Data

US 2016/0013337 A1    Jan. 14, 2016

(30) Foreign Application Priority Data

Jul. 10, 2014    (JP) ................................. 2014-142327

(51) Int. Cl.
*H01L 31/042*      (2014.01)
*H01L 31/0392*    (2006.01)
(Continued)

(52) U.S. Cl.
CPC .... *H01L 31/03926* (2013.01); *H01L 31/0508* (2013.01); *H02S 40/22* (2014.12);
(Continued)

(58) Field of Classification Search
CPC ......... H02S 40/34; H05K 1/028; H05K 1/189
(Continued)

(56) References Cited

U.S. PATENT DOCUMENTS

2006/0244177 A1* 11/2006 Kaneto .................... A61B 5/03
                                                                    264/248
2012/0186860 A1*  7/2012 Takaoka ................. H05K 1/028
                                                                    174/254
(Continued)

FOREIGN PATENT DOCUMENTS

CN          1856213 A       11/2006
JP      2007-019334 A        1/2007
(Continued)

OTHER PUBLICATIONS

English translation of Takagi, JP2001-298217.*
(Continued)

*Primary Examiner* — Niki Bakhtiari
(74) *Attorney, Agent, or Firm* — Venable LLP; Michael A. Satori; Laura G. Remus

(57) ABSTRACT

A photovoltaic module includes: a flexible printed circuit; and a plurality of power generating elements mounted on the flexible printed circuit, wherein the flexible printed circuit includes a turning portion, and strip-shaped portions of the flexible printed circuit which are located on opposite sides of the turning portion are aligned so as to oppose each other.

10 Claims, 21 Drawing Sheets

(51) Int. Cl.
  *H02S 40/34*   (2014.01)
  *H05K 3/30*    (2006.01)
  *H01L 31/05*   (2014.01)
  *H02S 40/22*   (2014.01)
  *H05K 1/02*    (2006.01)
  *H05K 1/18*    (2006.01)

(52) U.S. Cl.
  CPC ............ *H02S 40/34* (2014.12); *H05K 1/028* (2013.01); *H05K 3/301* (2013.01); *H05K 1/189* (2013.01); *H05K 2201/046* (2013.01); *H05K 2201/09263* (2013.01); *H05K 2201/10121* (2013.01); *Y02E 10/52* (2013.01)

(58) Field of Classification Search
  USPC .................................................. 136/243–265
  See application file for complete search history.

(56) References Cited

U.S. PATENT DOCUMENTS

2012/0279551 A1    11/2012    Garboushian et al.
2014/0230883 A1    8/2014     Iwasaki et al.

FOREIGN PATENT DOCUMENTS

| | | |
|---|---|---|
| JP | 2011-210747 A | 10/2011 |
| JP | 2013-080760 A | 5/2013 |
| JP | 2013-84855 A | 5/2013 |
| JP | 2014-035502 A | 2/2014 |
| WO | WO2013-051426 * | 4/2013 |

OTHER PUBLICATIONS

International Search Report in International Application No. PCT/JP2015/069404, dated Aug. 11, 2015.
International Search Report in International Application No. PCT/JP2015/069407, dated Aug. 11, 2015.
International Search Report in International Application No. PCT/JP2015/069409, dated Aug. 11, 2015.
International Search Report in International Application No. PCT/JP2015/069411, dated Sep. 8, 2015.

* cited by examiner

PHOTOVOLTAIC MODULE, PHOTOVOLTAIC APPARATUS, AND METHOD FOR PRODUCING PHOTOVOLTAIC MODULE

TECHNICAL FIELD

The present invention relates to a photovoltaic module, a photovoltaic apparatus, and a method for producing the photovoltaic module, and in particular, to a photovoltaic module and a photovoltaic apparatus which use a flexible printed circuit, and a method for producing the photovoltaic module.

BACKGROUND ART

There have been developed concentrator photovoltaic apparatuses in which sunlight is converged onto power generating elements by use of lenses and the like to increase the power generating efficiency of the power generating elements.

As one example of a concentrator photovoltaic apparatus, Japanese Laid-Open Patent Publication No. 2013-84855 (PATENT LITERATURE 1) discloses a technology as below. That is, a concentrator solar cell module includes: a plurality of solar cell elements; an elongated receiver substrate having the solar cell elements arranged thereon in a single line at constant intervals; and a module substrate having a plurality of the receiver substrates arranged thereon in parallel at constant intervals. In the concentrator solar cell module, each receiver substrate includes: an elongated receiver base; and a plurality of wiring members arranged on the receiver base in a single line along the lengthwise direction, with their adjacent ends opposing each other. A positive electrode pad portion is provided on one end of each wiring member, and a negative electrode pad portion is provided on the other end thereof. The positive electrode terminal of each solar cell element is connected to the positive electrode pad portion, and the negative electrode terminal of the solar cell element is connected to the negative electrode pad portion, whereby a solar cell element mounting portion is formed.

CITATION LIST

Patent Literature

PATENT LITERATURE 1: Japanese Laid-Open Patent Publication No. 2013-84855

SUMMARY OF INVENTION

Technical Problem

However, in a case where the receiver substrate and the wiring members are connected together through soldering or welding, for example, the portions having been subjected to soldering, welding, or the like are highly likely to deteriorate over years. Thus, long-term reliability of the product might be reduced.

In addition, connection through soldering, welding, or the like may require a large man-hour, which is likely to cause increased production costs.

The present invention has been made in order to solve the above problems. An object of the present invention is to provide a photovoltaic module, a photovoltaic apparatus, and a method for producing the photovoltaic module that can realize high reliability and reduce production costs.

Solution to Problem (1) In order to solve the above problems, a photovoltaic module according to an aspect of this invention includes: a flexible printed circuit; and a plurality of power generating elements mounted on the flexible printed circuit. In the photovoltaic module, the flexible printed circuit includes a turning portion, and strip-shaped portions of the flexible printed circuit which are located on opposite sides of the turning portion are aligned so as to oppose each other.

(10) In order to solve the above problems, a photovoltaic apparatus according to an aspect of this invention includes a plurality of photovoltaic modules. In the photovoltaic apparatus, each of the photovoltaic modules includes: a flexible printed circuit; and a plurality of power generating elements mounted on the flexible printed circuit, the power generating elements are connected to each other in series, the flexible printed circuit includes a turning portion, strip-shaped portions of the flexible printed circuit which are located on opposite sides of the turning portion are aligned so as to oppose each other, and sets of the power generating elements of the respective photovoltaic modules are connected to each other in parallel.

(11) In order to solve the above problems, a method for producing of a photovoltaic module according to an aspect of this invention is a method for producing a photovoltaic module, the photovoltaic module including: a flexible printed circuit including a plurality of strip-shaped portions; and a plurality of power generating elements, the method including the steps of: mounting the power generating elements on each strip-shaped portion; and bending a connection portion of the flexible printed circuit connecting the strip-shaped portions, such that the power generating elements mounted on the respective strip-shaped portions are aligned so as to oppose each other.

Advantageous Effects of Invention

According to this invention, it is possible to realize high reliability and to reduce production costs of a photovoltaic module, a photovoltaic apparatus, and a method for producing the photovoltaic module.

DESCRIPTION OF EMBODIMENTS

Figure 1:
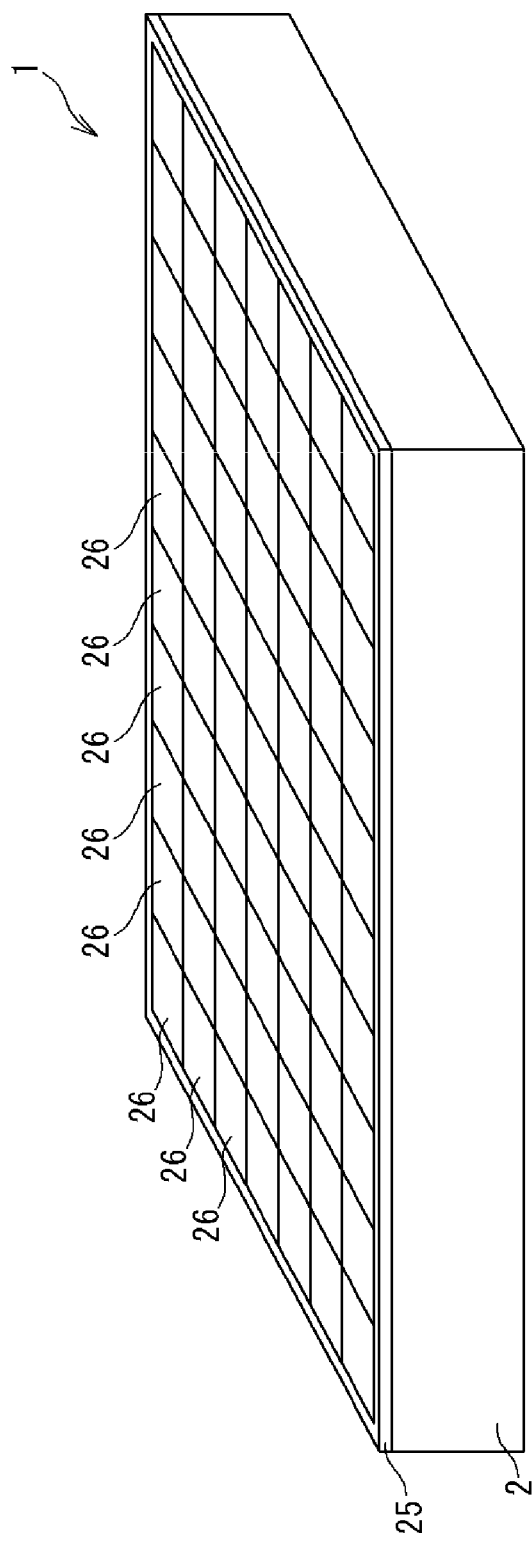
FIG. 1 is a perspective view of a photovoltaic module according to a first embodiment of the present invention.

First, contents of embodiments of the present invention are described by listing them.

(1) A photovoltaic module according to an embodiment of the present invention includes: a flexible printed circuit; and a plurality of power generating elements mounted on the flexible printed circuit. In the photovoltaic module, the flexible printed circuit includes a turning portion, and strip-shaped portions of the flexible printed circuit which are located on opposite sides of the turning portion are aligned so as to oppose each other.

According to the configuration in which the strip-shaped portions and the turning portion which connects these strip-shaped portions are integrally formed by use of a single flexible printed circuit, the work of soldering or the like for electrically connecting the strip-shaped portions to each other is not required. In addition, for example, by manufacturing a flexible printed circuit having a flat shape on which the strip-shaped portions are densely arranged, and then by bending the connection portion of each strip-shaped portion in the flexible printed circuit to form the turning portion, it is possible to widen the interval between the strip-shaped portions. Therefore, in comparison with a case of manufacturing a flexible printed circuit originally having a wide interval between the strip-shaped portions, it is possible to reduce the use area of the film being the material of the flexible printed circuit. Accordingly, it is possible to increase the number of flexible printed circuits that can be manufactured in one production process of the flexible printed circuit, and it is possible to reduce the amount of material to be discarded. Thus, it is possible to realize high reliability and to reduce production costs.

(2) Preferably, the turning portion is provided to make a turn such that the power generating elements mounted on the respective strip-shaped portions are aligned so as to oppose each other.

According to this configuration, it is possible to arrange the power generating elements in an arrayed manner, and thus, for example, designing of the optical system in the photovoltaic module is facilitated.

(3) More preferably, the turning portion is provided to make a turn such that a distance between the power generating elements opposing each other is equal to an interval between the power generating elements adjacent to each other in each strip-shaped portion.

According to this configuration, it is possible to densely arrange a plurality of Fresnel lenses of the same shape in a square lattice pattern, for example, and to arrange the power generating elements on the optical axes of the respective Fresnel lenses. Therefore, it is possible to increase the amount of generated power per unit area of the light receiving surface of the photovoltaic module.

(4) Preferably, the turning portion includes three folded portions, and the three folded portions are linearly arranged.

According to this configuration, since the shape of the turning portion is fixed, it is possible to arrange the strip-shaped portions located on opposite sides of the turning portion at a predetermined interval. Moreover, in a case where the flexible printed circuit includes a plurality of turning portions and strip-shaped portions on opposite sides of each turning portion, it is possible to reduce variation in the interval between the strip-shaped portions located on opposite sides of each turning portion.

(5) Preferably, the turning portion has a cutout formed therein.

According to this configuration, the connection portion of each strip-shaped portion can be bent through simple operation, and thus, the turning portion can be easily formed.

(6) Preferably, the turning portion is provided to make a turn such that the power generating elements mounted on the respective strip-shaped portions are aligned so as to oppose each other, the turning portion includes three folded portions, the three folded portions are linearly arranged, and in the flexible printed circuit, lengths of parts from the folded portion at a center to the power generating elements opposing each other are different from each other.

According to this configuration, for example, in the flexible printed circuit having a flat shape in a state before the turning portion is formed, the parts where the power generating elements are mounted in each strip-shaped portion are not aligned with the parts where the power generating elements are mounted in another strip-shaped portion adjacent to that strip-shaped portion. Accordingly, for example, by reducing, in each strip-shaped portion, the width of the parts where the power generating elements are not mounted relative to the width of the parts where the power generating elements are mounted, it is possible to manufacture the flexible printed circuit on which the strip-shaped portions are more densely arranged. Thus, it is possible to further reduce the use area of the film being the material of the flexible printed circuit.

(7) Preferably, the turning portion includes three folded portions, and in the flexible printed circuit, lengths of parts from the folded portion at a center to the folded portions on opposite sides are different from each other.

According to this configuration, for example, in the flexible printed circuit having a flat shape in a state before the turning portion is formed, the parts corresponding to the folded portions on opposite sides are not aligned with each other. Thus, it is possible to manufacture the flexible printed circuit on which the strip-shaped portions are more densely arranged. Thus, it is possible to further reduce the use area of the film being the material of the flexible printed circuit.

(8) Preferably, the photovoltaic module further includes a base portion on which the flexible printed circuit is fixed, and the flexible printed circuit includes a curved portion as the turning portion, a part or entirety of the curved portion being detached from the base portion.

According to the configuration in which the turning portion is not formed by folding, it is possible to reduce man-hour in production of the photovoltaic module. In addition, for example, the turning portion is detached from the base portion which is made of metal and on which the strip-shaped portion of the flexible printed circuit is fixed, whereby it is possible to suppress generation of discharge between the conductive portion of the turning portion and the base portion.

(9) Preferably, the turning portion and the strip-shaped portions each include a conductive portion, and an insulating portion which covers the conductive portion, the conductive portion of the turning portion and the conductive portion of each strip-shaped portion are continued to each other, and the insulating portion of the turning portion and the insulating portion of each strip-shaped portion are continued to each other.

According to this configuration, no conductor is exposed on the connection portion between the strip-shaped portion and the turning portion. Accordingly, it is not necessary to apply resin or the like for protecting exposed parts of the conductor from water drops and the like caused by dew condensation, for example.

(10) A photovoltaic apparatus according to an embodiment of the present invention includes: a plurality of photovoltaic modules. In the photovoltaic apparatus, each of the photovoltaic modules includes: a flexible printed circuit; and a plurality of power generating elements mounted on the flexible printed circuit, the power generating elements are connected to each other in series, the flexible printed circuit includes a turning portion, strip-shaped portions of the flexible printed circuit which are located on opposite sides of the turning portion are aligned so as to oppose each other, and sets of the power generating elements of the respective photovoltaic modules are connected to each other in parallel.

According to the configuration in which the strip-shaped portions and the turning portion which connects these strip-shaped portions are integrally formed by use of a single flexible printed circuit, the work of soldering or the like for electrically connecting the strip-shaped portions to each other is not required. In addition, for example, by manufacturing a flexible printed circuit having a flat shape on which the strip-shaped portions are densely arranged, and then by bending the connection portion of each strip-shaped portion in the flexible printed circuit to form the turning portion, it is possible to widen the interval between the strip-shaped portions. Therefore, compared with a case of manufacturing a flexible printed circuit originally having a wide interval between the strip-shaped portions, it is possible to reduce the use area of the film being the material of the flexible printed circuit. Accordingly, it is possible to increase the number of flexible printed circuits that can be manufactured in one production process of the flexible printed circuit, and it is possible to reduce the amount of material to be discarded. Thus, it is possible to realize high reliability and to reduce production costs.

In addition, by use of the photovoltaic module having increased reliability and reduced production costs, it is possible to obtain an output of high voltage and large current. Moreover, since the power generating elements included in the photovoltaic module are connected to each other in series, the magnitude of the current flowing in each photovoltaic module can be reduced. Furthermore, for example, even in a case where one of the photovoltaic modules has failed, output voltage of the photovoltaic apparatus can be maintained.

(11) A method for producing a photovoltaic module according to an embodiment of the present invention is a method for producing a photovoltaic module, the photovoltaic module including: a flexible printed circuit including a plurality of strip-shaped portions; and a plurality of power generating elements, the method including the steps of: mounting the power generating elements on each strip-shaped portion; and bending a connection portion of the flexible printed circuit connecting the strip-shaped portions, such that the power generating elements mounted on the respective strip-shaped portions are aligned so as to oppose each other.

Thus, by integrally forming the strip-shaped portions and the turning portions connecting these strip-shaped portions by use of a single flexible printed circuit, the work of soldering or the like for electrically connecting the strip-shaped portions to each other is not required. For example, by manufacturing a flexible printed circuit having a flat shape on which the strip-shaped portions are densely arranged, and then by bending the connection portion of each strip-shaped portion in the flexible printed circuit to form the turning portion, it is possible to widen the interval between the strip-shaped portions. Thus, compared with a case of manufacturing a flexible printed circuit originally having a wide interval between the strip-shaped portions, it is possible to reduce the use area of the film being the material of the flexible printed circuit. Accordingly, it is possible to increase the number of flexible printed circuits that can be manufactured in one production process of the flexible printed circuit, and to reduce the amount of material to be discarded. Thus, it is possible to realize high reliability and to reduce production costs.

In addition, since it is possible to arrange the power generating elements in an arrayed state, designing of the optical system in the photovoltaic module is facilitated, for example.

Hereinafter, embodiments of the present invention will be described with reference to the drawings. The same or corresponding parts are denoted by the same reference characters, and description thereof is not repeated. In addition, at least parts of embodiments described below may be used in combination.

First Embodiment

[Configuration and Basic Operation]

Figure 2:
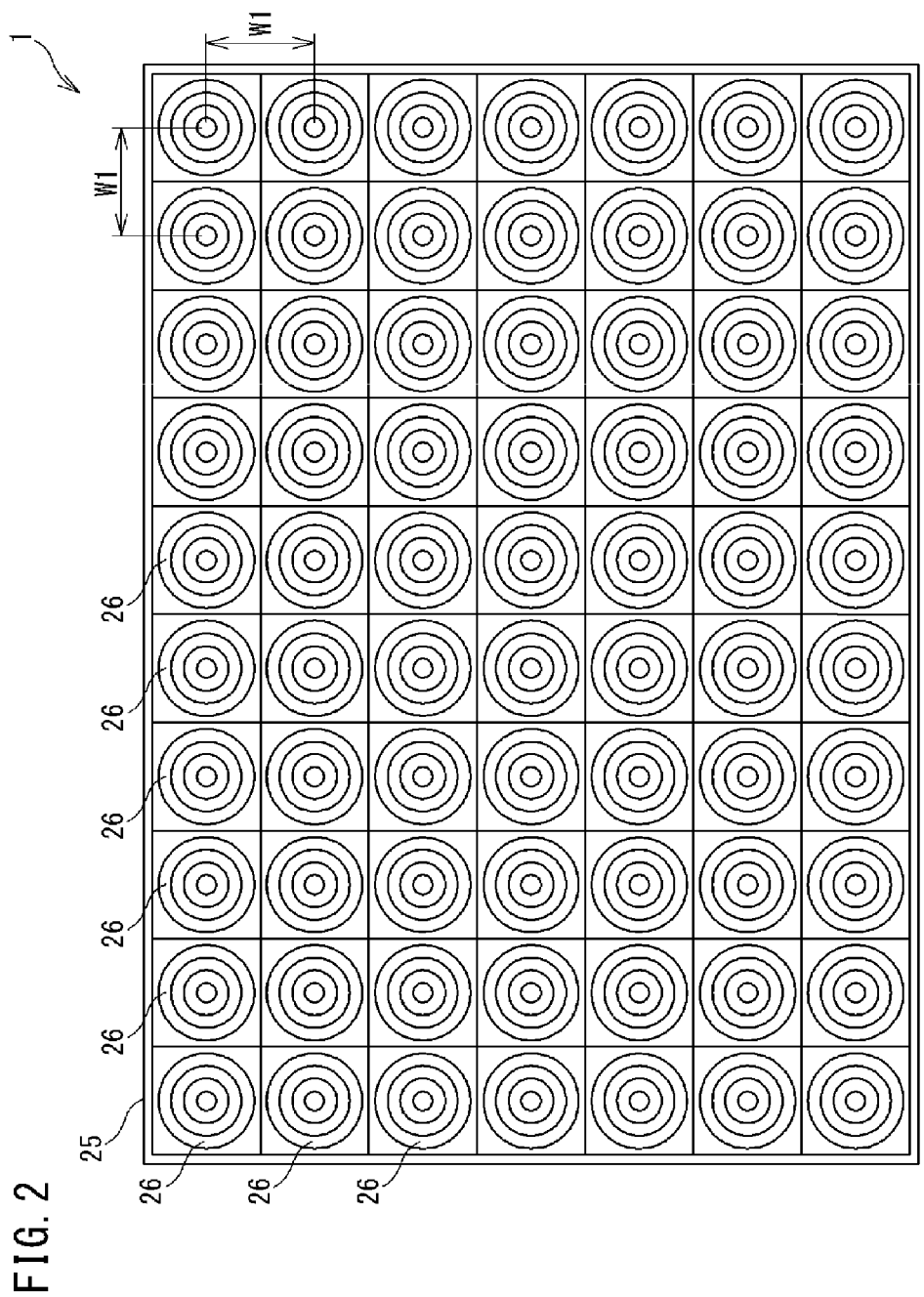
FIG. 2 is a plan view of the photovoltaic module according to the first embodiment of the present invention.

FIG. 1 is a perspective view of a photovoltaic module according to a first embodiment of the present invention. FIG. 2 is a plan view of the photovoltaic module according to the first embodiment of the present invention.

With reference to FIG. 1 and FIG. 2, a photovoltaic module 1 includes a housing 2, and a concentrating portion 25. The concentrating portion 25 includes a plurality of Fresnel lenses 26.

In the concentrating portion 25, the Fresnel lenses 26 are arranged in a square lattice pattern, for example. Specifically, the Fresnel lenses 26 are arranged such that the distance between the centers of Fresnel lenses 26 that are adjacent to each other is W1, for example. The size of each Fresnel lens 26 is 50 mm×50 mm, for example.

Figure 3:
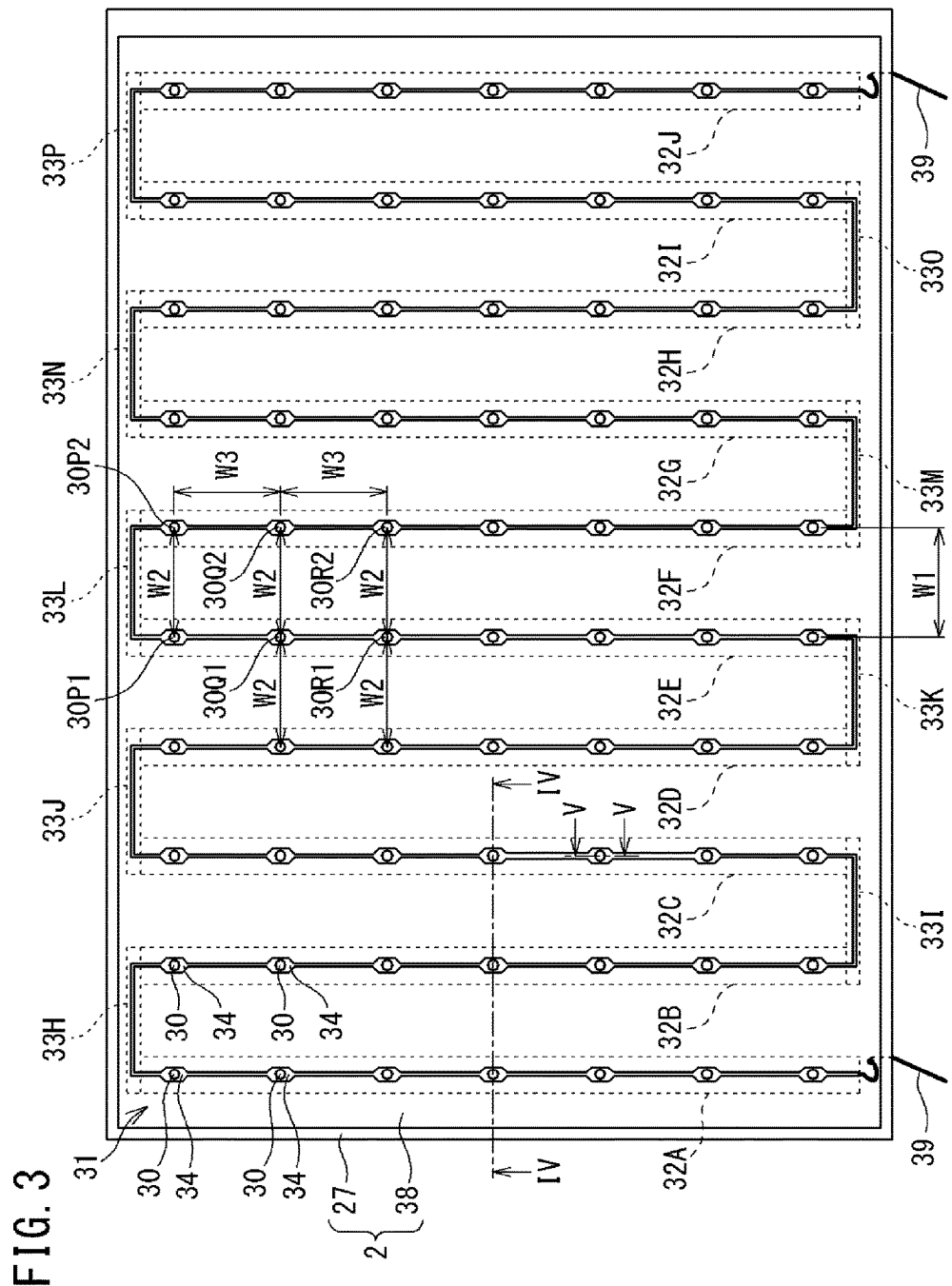
FIG. 3 is a plan view showing the inside of the housing of the photovoltaic module according to the first embodiment of the present invention.

FIG. 3 is a plan view showing the inside of the housing of the photovoltaic module according to the first embodiment of the present invention.

With reference to FIG. 3, the photovoltaic module 1 includes the housing 2, a plurality of power generating portions 30, a FPC (flexible printed circuit) 31, two lead wires 39, and a reinforcement plate 60 not shown. The housing 2 includes a wall portion 27 and a base portion 38 which is the bottom. The FPC 31 includes strip-shaped portions 32A to 32J and turning portions 33H to 33P.

The turning portion 33H connects the strip-shaped portion 32A and the strip-shaped portion 32B each other. The turning portion 33I connects the strip-shaped portion 32B and the strip-shaped portion 32C. The turning portion 33J connects the strip-shaped portion 32C and the strip-shaped portion 32D. The turning portion 33K connects the strip-shaped portion 32D and the strip-shaped portion 32E. The turning portion 33L connects the strip-shaped portion 32E and the strip-shaped portion 32F. The turning portion 33M connects the strip-shaped portion 32F and the strip-shaped portion 32G The turning portion 33N connects the strip-shaped portion 32G and the strip-shaped portion 32H. The turning portion 33O connects the strip-shaped portion 32H and the strip-shaped portion 32I. The turning portion 33P connects the strip-shaped portion 32I and the strip-shaped portion 32J.

Hereinafter, each of the strip-shaped portions 32A to 32J will also be referred to as a strip-shaped portion 32. Furthermore, each of the turning portions 33H to 33P will also be referred to as a turning portion 33. Each strip-shaped portion 32 includes seven element-mounted portions 34.

The FPC 31 is fixed on the upper main surface of the base portion 38. In each strip-shaped portion 32 of the FPC 31, each element-mounted portion 34 has a wider width than the other portion. Each power generating portion 30 is mounted on the upper main surface of its corresponding element-mounted portion 34.

Here, the strip-shaped portion 32E includes power generating portions 30P1, 30Q1, and 30R1 mounted thereon as the power generating portions 30. The strip-shaped portion 32F includes power generating portions 30P2, 30Q2, and 30R2 mounted thereon as the power generating portions 30.

The reinforcement plate 60 not shown is adhered to the lower main surface of each strip-shaped portion 32, that is, to the main surface of the strip-shaped portion 32 on the side where no power generating portions 30 are mounted. The reinforcement plate 60 secures slight hardness for the strip-shaped portion 32, to facilitate handling of the FPC 31 during production of the photovoltaic module 1. The material of the reinforcement plate 60 is aluminium, for example.

In the FPC 31, the portion that connects two strip-shaped portions 32 is defined as a connection portion 133. Each turning portion 33 is a portion formed by the connection portion 133 being bent.

In the photovoltaic module 1, the strip-shaped portions 32 located on opposite sides of each turning portion 33 are aligned so as to oppose each other. Specifically, for example, the strip-shaped portion 32E and the strip-shaped portion 32F located on opposite sides of the turning portion 33L are aligned so as to oppose each other.

More specifically, the strip-shaped portion 32E and the strip-shaped portion 32F oppose each other, in a state of being aligned in the widthwise direction of the strip-shaped portion 32E and the strip-shaped portion 32F, for example.

In other words, a connection portion 133L, being the connection portion 133 from which the turning portion 33L is formed, is bent along the extending surface of the strip-shaped portion 32E and the strip-shaped portion 32F, for example, whereby the strip-shaped portion 32E and the strip-shaped portion 32F are aligned on the extending surface so as to oppose each other.

In other words, the strip-shaped portion 32E and the strip-shaped portion 32F oppose each other, not with the turning portion 33L interposed therebetween but with space interposed therebetween.

The power generating portions 30 mounted on each strip-shaped portion 32 oppose the power generating portions 30 mounted on another strip-shaped portion 32 adjacent to, i.e., opposing, that strip-shaped portion 32, for example.

More specifically, for example, the power generating portions 30P1, 30Q1, and 30R1 mounted on the strip-shaped portion 32E oppose the power generating portions 30P2, 30Q2, and 30R2 mounted on the strip-shaped portion 32F, respectively.

In addition, for example, a distance W2 between power generating portions 30 opposing each other is equal to an interval W3 between power generating portions 30 adjacent to each other in each strip-shaped portion 32. Specifically, for example, the distance W2 between the power generating portion 30P1 and the power generating portion 30P2, which are the power generating portions 30 opposing each other, is equal to the interval W3 between the power generating portion 30P2 and the power generating portion 30Q2 adjacent to each other in the strip-shaped portion 32F.

In addition, for example, the distance W2 and the interval W3 are equal to the distance W1 between the centers of the Fresnel lenses 26 shown in FIG. 2.

The lead wires 39 are respectively connected to two ends of the FPC 31. The lead wires 39 respectively pass through through-holes provided in the base portion 38, and are connected to a junction box being a relay box for connecting a plurality of the photovoltaic modules 1 together, for example.

One Fresnel lens 26 is provided for one power generating portion 30. Each power generating portion 30 is disposed on the optical axis of its corresponding Fresnel lens 26.

Figure 4:
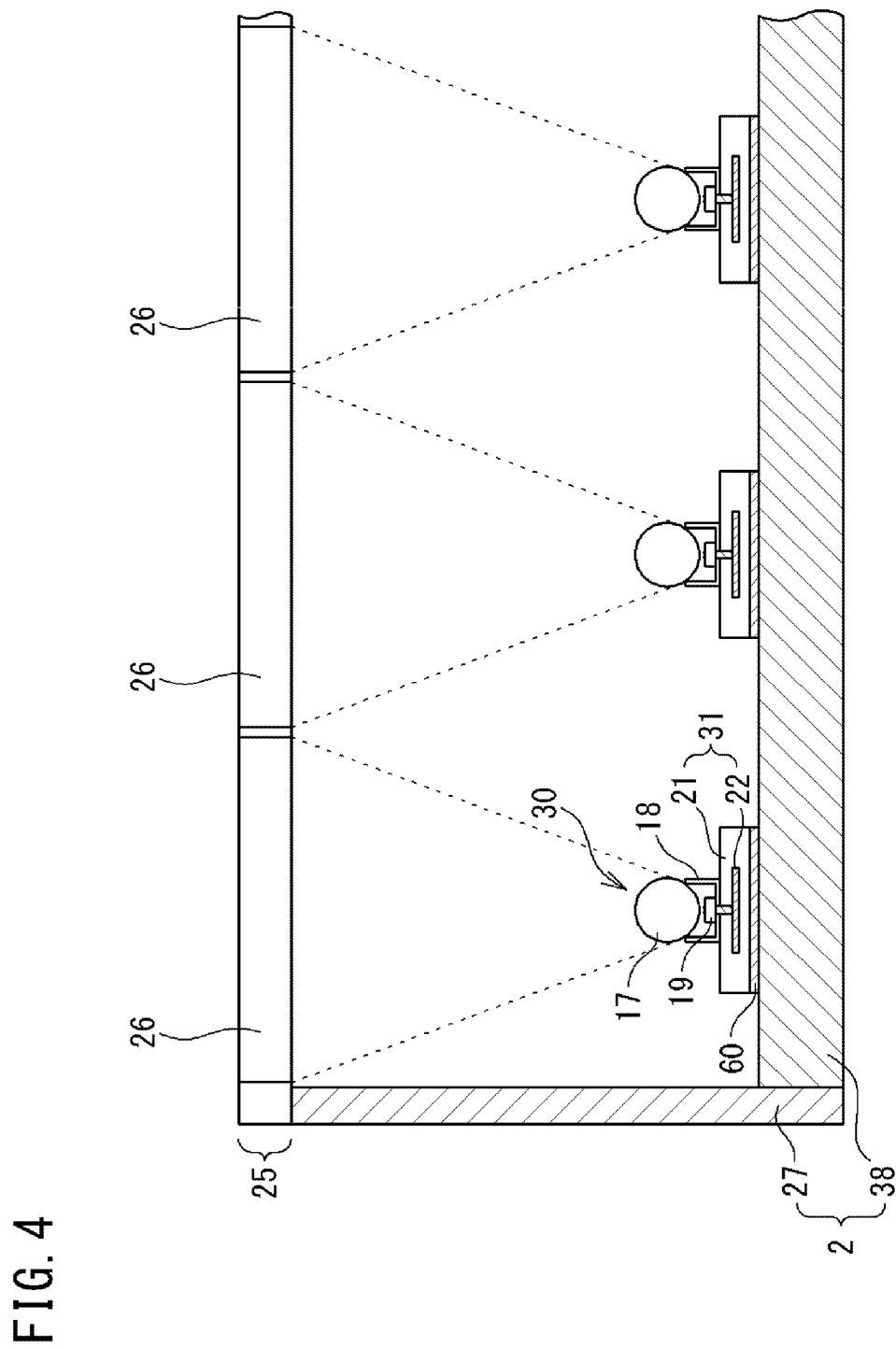
FIG. 4 is a cross-sectional view showing a cross section along the IV-IV line in FIG. 3 of the photovoltaic apparatus according to the first embodiment of the present invention.

FIG. 4 is a cross-sectional view showing a cross section along the IV-IV line in FIG. 3 of the photovoltaic apparatus according to the first embodiment of the present invention.

With reference to FIG. 4, each power generating portion 30 includes a ball lens 17, a package 18, and a power generating element 19. The FPC 31 includes an insulating portion 21 and a conductive portion 22. The insulating portion 21 covers the conductive portion 22. The FPC 31 is fixed to the surface of the base portion 38 via the reinforcement plate 60.

Each power generating element 19 includes a semiconductor device, for example, and is housed in the package 18. The power generating element 19, housed in the package 18, is mounted on the FPC 31. The size of the power generating element 19 is 3.2 mm×3.2 mm, for example.

Each Fresnel lens 26 converges sunlight onto its corresponding ball lens 17. The ball lens 17 further converges the sunlight converged by the Fresnel lens 26, onto the power generating element 19.

The power generating element 19 receives the sunlight converged by the Fresnel lens 26 and the ball lens 17, to generate electric power corresponding to the amount of the received light.

Figure 5:
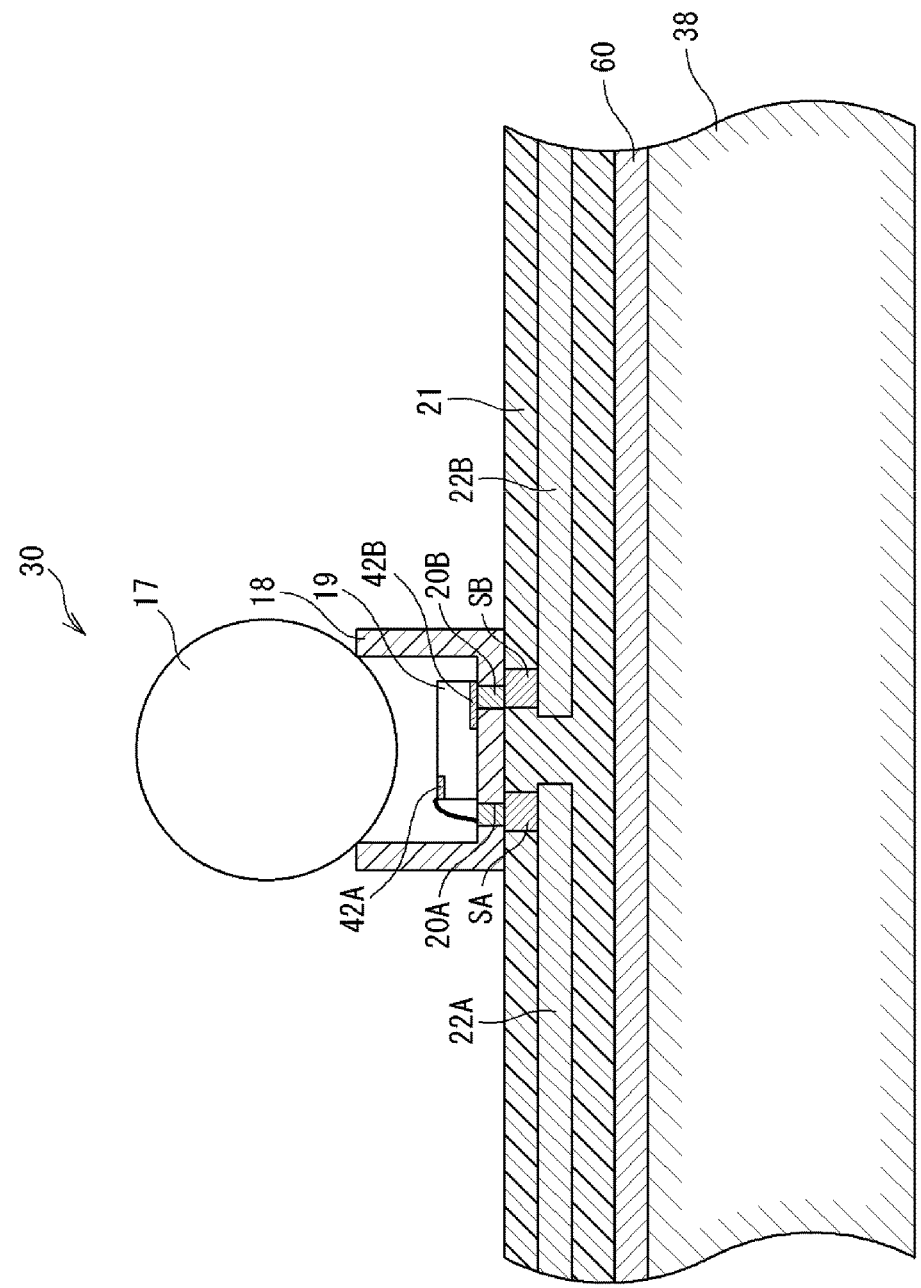
FIG. 5 is a cross-sectional view showing a cross section along the V-V line in FIG. 3 of a power generating portion in the photovoltaic apparatus according to the first embodiment of the present invention.

FIG. 5 is a cross-sectional view showing a cross section along the V-V line in FIG. 3 of the power generating portion in the photovoltaic apparatus according to the first embodiment of the present invention.

With reference to FIG. 5, the power generating element 19 includes an element electrode 42A and an element electrode 42B, and outputs voltage from the element electrode 42A and the element electrode 42B.

The package 18 includes a package electrode 20A and a package electrode 20B. The package electrode 20A and the package electrode 20B are provided so as to penetrate the bottom of the package 18, and are exposed both on the upper side and the lower side of the bottom.

The power generating element 19, housed in the package 18, is mounted on the FPC 31. Specifically, the power generating element 19 is fixed to the package 18 and the package 18 is fixed to the FPC 31.

More specifically, the element electrode 42A of the power generating element 19 is connected to the package electrode 20A through wire bonding, for example. The element electrode 42B is connected to the package electrode 20B through soldering, for example.

The package electrode 20A is connected through soldering to a conductive portion 22A being a part of the conductive portion 22. That is, the package electrode 20A is connected to the conductive portion 22A via a solder portion SA.

The package electrode 20B is connected through soldering to a conductive portion 22B being a part of the conductive portion 22. That is, the package electrode 20B is connected to the conductive portion 22B via a solder portion SB.

The package 18 supports the ball lens 17 at the edge of the side wall of the package 18, and fixes the focal point of the ball lens 17 to the power generating element 19.

The temperature of the power generating element 19 increases because the power generating element 19 receives sunlight converged by the Fresnel lens 26 and the ball lens 17. When the temperature of the power generating element 19 becomes high, the power generating efficiency is reduced.

Heat of the power generating element 19 is transferred to the base portion 38, via the package 18, the FPC 31, and the reinforcement plate 60. Thus, the base portion 38 also functions as a heat dissipation plate for the power generating element 19. For example, a preferred material of the base portion 38 is aluminium or copper, which has a high heat conductivity and a relatively light weight.

Figure 6:
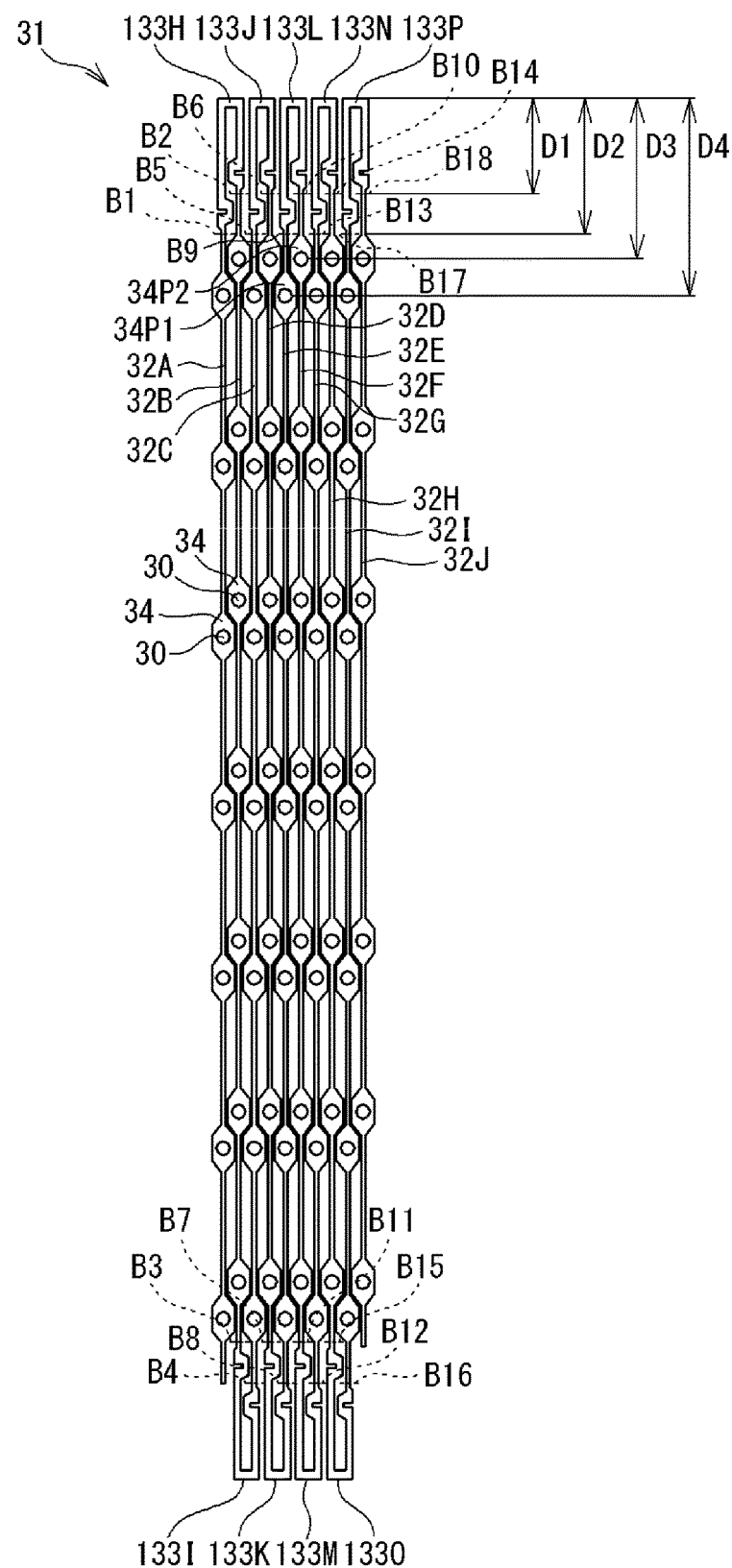
FIG. 6 shows a state before connection portions of a FPC in the photovoltaic module according to the first embodiment of the present invention are bent.

FIG. 6 shows a state before the connection portions of the FPC in the photovoltaic module according to the first embodiment of the present invention are bent.

With reference to FIG. 6, the FPC 31 includes the strip-shaped portion 32A to 32J, and the connection portions 133H to 133P as the connection portions 133. The connection portions 133H to 133P respectively correspond to the turning portions 33H to 33P shown in FIG. 3, for example. Further, the boundaries between the strip-shaped portions 32 and the connection portions 133 are defined as boundaries B1 to B18, respectively.

The distance between the strip-shaped portions 32 adjacent to each other in FIG. 6 is shorter than the distance between the strip-shaped portions 32 adjacent to each other in FIG. 3. In addition, each strip-shaped portion 32 is located so as to be shifted from its adjacent strip-shaped portion 32, in the lengthwise direction of the strip-shaped portion 32.

For example, the boundary B9 which is the boundary between the strip-shaped portion 32E and connection portion 133L, and the boundary B10 which is the boundary between the strip-shaped portion 32F and the connection portion 133L are located so as to be shifted from each other.

More specifically, a distance D2 from an edge of the connection portion 133L to the boundary B9 is different from a distance D1 from the edge of the connection portion 133L to the boundary B10.

Accordingly, the element-mounted portions 34 which are parts where the power generating portions 30 are respectively mounted in each strip-shaped portion 32, and the element-mounted portions 34 in its adjacent strip-shaped portion 32 are located so as to be shifted from each other.

For example, the distance from the center of an element-mounted portion 34P1 being the element-mounted portion 34 that is closest to the connection portion 133L among the element-mounted portions 34 in the strip-shaped portion 32E, to the edge of the connection portion 133L is defined as D4. In addition, the distance from the center of an element-mounted portion 34P2 being the element-mounted portion 34 that is closest to the connection portion 133L among the element-mounted portions 34 in the strip-shaped portion 32F, to the edge of the connection portion 133L is defined as D3. At this time, the distance D3 and the distance D4 are different from each other.

According to this configuration, it is possible to manufacture the FPC 31 having a shape on which the strip-shaped portions 32 are more densely arranged. Thus, for example, it is possible to manufacture the FPC 31 having a larger number of strip-shaped portions 32, from the material of the flexible printed circuit having the same area.

Figure 7:
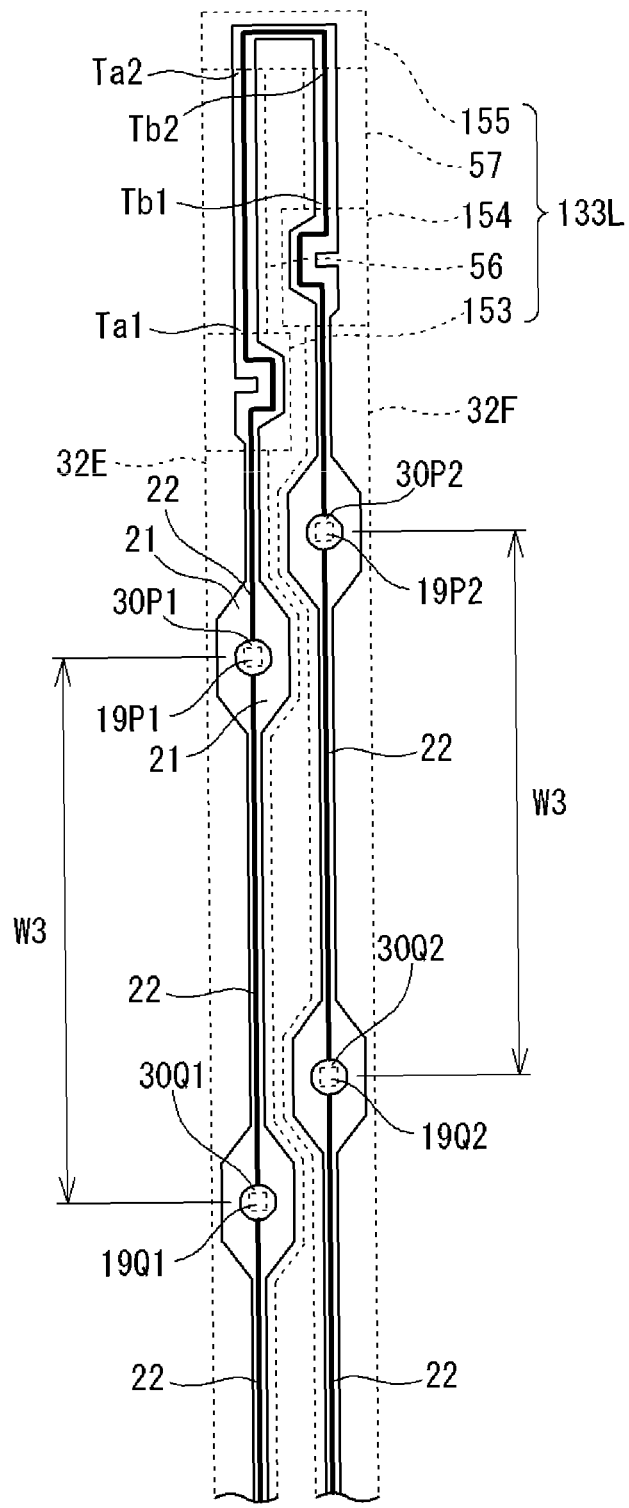
FIG. 7 shows in detail a part of the FPC shown in FIG. 6.
Figure 8:
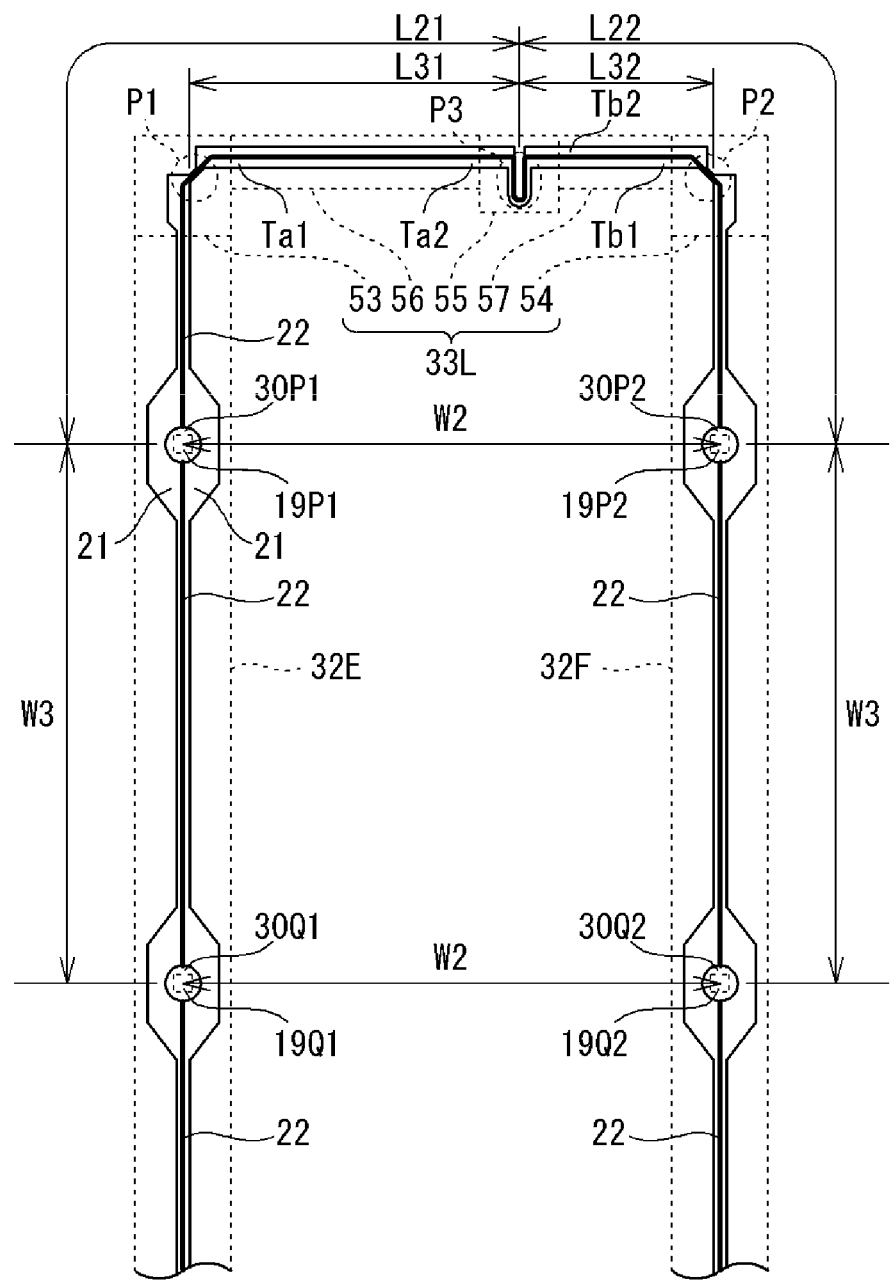
FIG. 8 shows a state after the connection portion shown in FIG. 7 has been bent.

FIG. 7 shows in detail a part of the FPC shown in FIG. 6. FIG. 8 shows a state after the connection portion shown in FIG. 7 has been bent.

With reference to FIG. 7, the connection portion 133L includes a first connection strip portion 56, a second connection strip portion 57, a first to-be-folded portion 153, a second to-be-folded portion 154, and a third to-be-folded portion 155.

The power generating portion 30P1, the power generating portion 30Q1, the power generating portion 30P2, and the power generating portion 30Q2 respectively include a power generating element 19P1, a power generating element 19Q1, a power generating element 19P2, and a power generating element 19Q2, as the power generating elements 19.

The connection portion 133L and the strip-shaped portions 32E and 32F each include the conductive portion 22, and the insulating portion 21 which covers the conductive portion 22 as shown in FIG. 4, for example. The conductive portion 22 connects the power generating elements 19 in series. It should be noted that the conductive portion 22 may connect the power generating elements 19 in parallel.

FIG. 8 shows a state where the FPC 31 has been fixed to the surface of the base portion 38. With reference to FIG. 8, the turning portion 33L includes a first folded portion 53, a second folded portion 54, a third folded portion 55, the first connection strip portion 56, and the second connection strip portion 57. The first connection strip portion 56 includes a first end Ta1 and a second end Ta2. The second connection strip portion 57 includes a first end Tb1 and a second end Tb2.

The turning portion 33L corresponds to the connection portion 133L shown in FIG. 7. The first folded portion 53 corresponds to the first to-be-folded portion 153 shown in FIG. 7. The second folded portion 54 corresponds to the second to-be-folded portion 154 shown in FIG. 7. The third folded portion 55 corresponds to the third to-be-folded portion 155 shown in FIG. 7.

As in the configuration shown in FIG. 7, the turning portion 33L and the strip-shaped portions 32E and 32F each include the conductive portion 22, and the insulating portion 21 which covers the conductive portion 22.

The conductive portion 22 of each turning portion 33 and the conductive portion 22 of its corresponding strip-shaped portion 32 are continued to each other, and the insulating portion 21 of each turning portion 33 and the insulating portion 21 of its corresponding strip-shaped portion 32 are continued to each other.

For example, the conductive portion 22 is covered with the insulating portion 21, except the parts where the power generating elements 19 are mounted and the parts where the lead wires 39 shown in FIG. 3 are connected.

The turning portion 33L is provided to make a turn such that the power generating elements 19 mounted on the strip-shaped portion 32E and the power generating elements 19 mounted on the strip-shaped portion 32F are aligned so as to oppose each other. More specifically, the power generating element 19P1 and the power generating element 19P2 oppose each other, in a state of being aligned in the widthwise direction of the strip-shaped portion 32E.

In addition, the three folded portions included in the turning portion 33L are linearly arranged. More specifically, in the photovoltaic module 1, the first folded portion 53, the third folded portion 55, and the second folded portion 54 are linearly arranged.

In the third folded portion 55, the FPC 31 has been folded by 180°. In the first folded portion 53 and the second folded portion 54, the FPC 31 has been folded by 90°.

The first folded portion 53 is continued to the strip-shaped portion 32E which is one of the strip-shaped portions 32 located on opposite sides of the turning portion 33. The second folded portion 54 is continued to the strip-shaped portion 32F which is the other one of the strip-shaped portions 32.

The first end Ta1 of the first connection strip portion 56 is connected to the first folded portion 53. The first end Tb1 of the second connection strip portion 57 is connected to the second folded portion 54. The third folded portion 55 connects the second end Ta2 of the first connection strip portion 56 and the second end Tb2 of the second connection strip portion 57.

In a state where the FPC 31 is fixed to the base portion 38, the third folded portion 55 includes the 180°-folded part, and the second end Ta2 of the first connection strip portion 56 and the second end Tb2 of the second connection strip portion 57 oppose each other, whereby the first connection strip portion 56 and the second connection strip portion 57 are linearly arranged. Moreover, the first folded portion 53 and the second folded portion 54 include the 90°-folded parts, respectively, whereby the strip-shaped portion 32E and the strip-shaped portion 32F oppose each other.

In addition, as described above, the power generating portion 30P1 and the power generating portion 30Q1 mounted on the strip-shaped portion 32E oppose the power generating portion 30P2 and the power generating portion 30Q2 mounted on the strip-shaped portion 32F, respectively.

Thus, the power generating element 19P1 included in the power generating portion 30P1 and the power generating element 19P2 included in the power generating portion 30P2 oppose each other. Furthermore, the power generating element 19Q1 included in the power generating portion 30Q1 and the power generating element 19Q2 included in the power generating portion 30Q2 oppose each other.

In addition, for example, the turning portion 33L is provided to make a turn such that the distance between each power generating element 19 mounted on the strip-shaped portion 32E and its corresponding power generating element 19 mounted on the strip-shaped portion 32F and facing that power generating element 19 on the strip-shaped portion 32E is equal to the interval between the power generating elements 19 adjacent to each other in the strip-shaped portion 32F, for example. More specifically, for example, the turning portion 33L is provided to make a turn such that the distance W2 between the power generating element 19P1 and the power generating element 19P2 opposing each other is equal to the interval W3 between the power generating element 19P2 and the power generating element 19Q2 adjacent to each other in the strip-shaped portion 32F.

Furthermore, in the FPC 31, the lengths of the parts from the folded portion at the center, i.e., the third folded portion 55, to the power generating elements 19 mounted on the strip-shaped portions 32 adjacent to each other and opposing each other are different from each other. Specifically, in the FPC 31, the length of the part from the third folded portion 55 to the power generating element 19P1 is different from the length of the part from the third folded portion 55 to the power generating element 19P2.

For example, in the third folded portion 55, the part which has been folded by 180° is defined as an angle forming portion P3. Furthermore, the length of the FPC 31 from the angle forming portion P3 to the power generating element 19 closest to the third folded portion 55 among the power generating elements 19 mounted on the strip-shaped portion 32E is defined as a length L21. Furthermore, the length of the FPC 31 from the angle forming portion P3 to the power generating element 19 closest to the third folded portion 55 among the power generating elements 19 mounted on the strip-shaped portion 32F is defined as a length L22. At this time, the length L21 is different from the length L22.

Furthermore, in the FPC 31, the lengths of the parts from the folded portion at the center to the folded portions on opposite sides are different from each other. Specifically, in the FPC 31, the length of the part from the third folded portion 55 to the first folded portion 53 is different from the length of the part from the third folded portion 55 to the second folded portion 54.

For example, in the first folded portion 53, the part which has been folded by 90° is defined as an angle forming portion P1. Furthermore, in the second folded portion 54, the part which has been folded by 90° is defined as an angle forming portion P2. At this time, a length L31 of the FPC 31 from the angle forming portion P3 to the angle forming portion P1 is different from a length L32 of the FPC 31 from the angle forming portion P3 to the angle forming portion P2.

Figure 9:
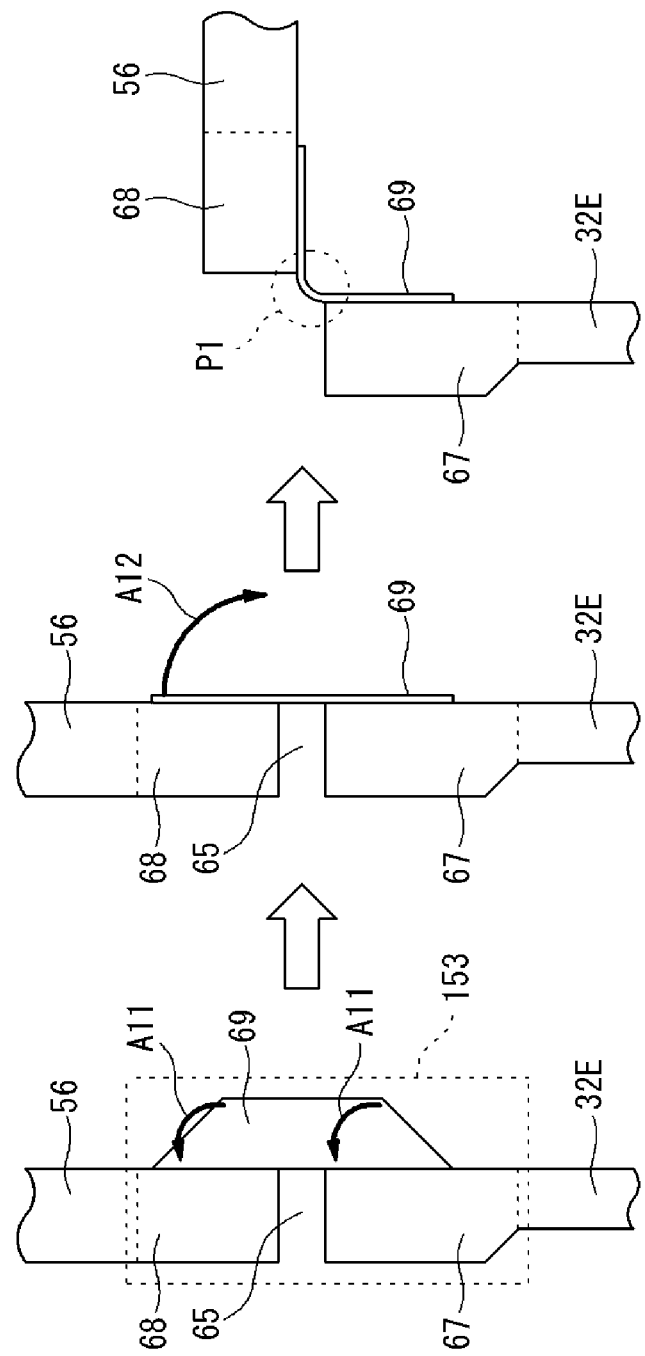
FIG. 9 illustrates folding of a first to-be-folded portion of the FPC in the photovoltaic module according to the first embodiment of the present invention.

FIG. 9 illustrates folding of the first to-be-folded portion 153 of the FPC in the photovoltaic module according to the first embodiment of the present invention.

With reference to FIG. 9, the first to-be-folded portion 153 includes fold constituent portions 67 to 69. The fold constituent portion 67 is a portion that is continued to the strip-shaped portion 32E. The fold constituent portion 68 is a portion that is continued to the first connection strip portion 56. The fold constituent portion 69 is a portion that connects the fold constituent portion 67 and the fold constituent portion 68.

The first to-be-folded portion 153 has a cutout 65 formed therein. The fold constituent portion 67 and the fold constituent portion 68 are separated from each other by the cutout 65.

When the first to-be-folded portion 153 is to be folded, first, the fold constituent portion 69 is folded into the direction of an arrow A11 such that the fold constituent portion 69 becomes perpendicular to the fold constituent portion 68 and the fold constituent portion 67.

Next, the fold constituent portion 69 being perpendicular to the fold constituent portion 68 and the fold constituent portion 67 is folded by 90° into the direction of an arrow A12.

Accordingly, the cutout 65 is widened and the angle between the strip-shaped portion 32E and the first connection strip portion 56 becomes 90°. The part P1 having been folded by 90° of the fold constituent portion 69 corresponds to the angle forming portion P1 shown in FIG. 8. It should be noted that the second to-be-folded portion 154 has a similar configuration to that of the first to-be-folded portion 153, and is folded similarly to the first to-be-folded portion 153.

Figure 10:
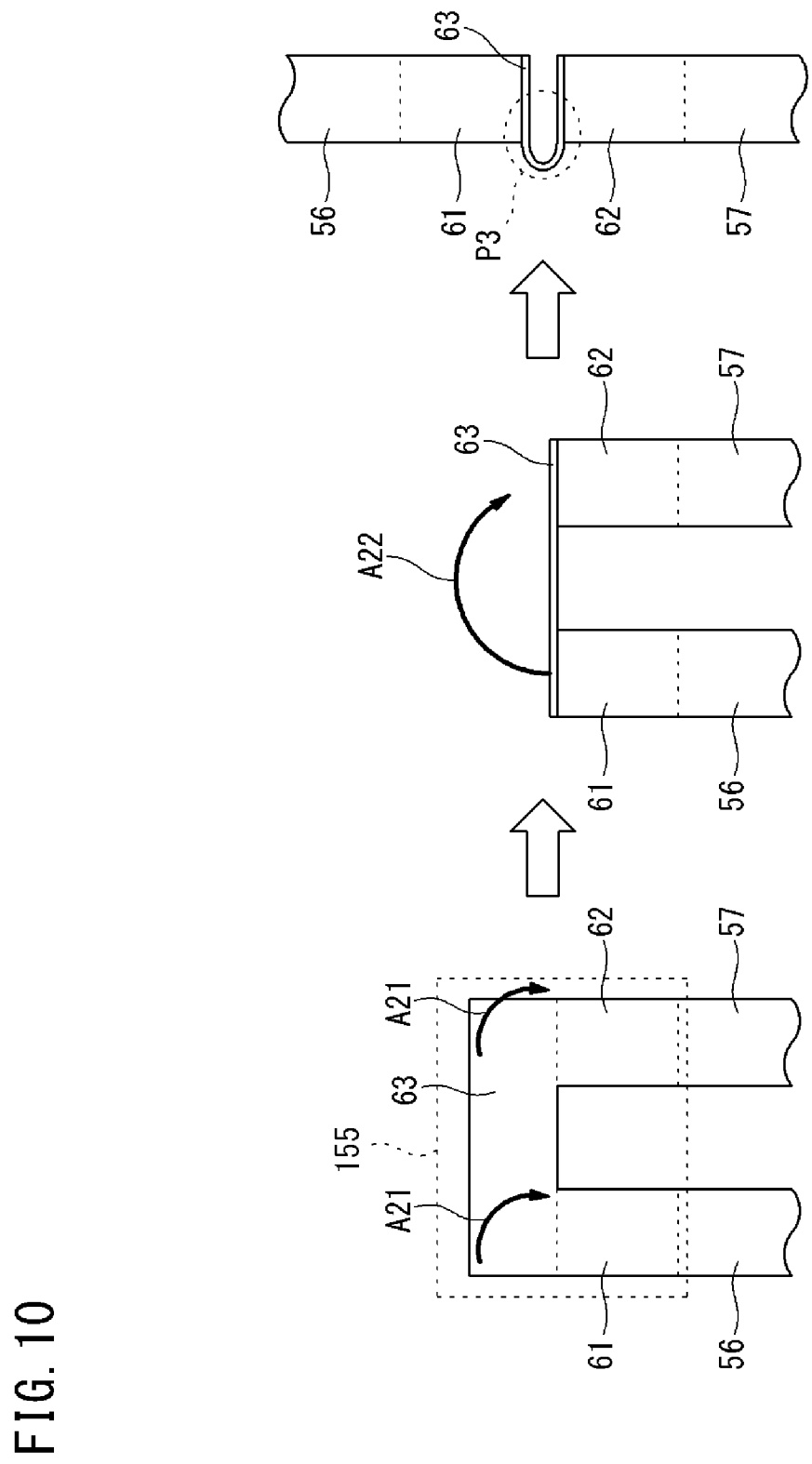
FIG. 10 illustrates folding of a third to-be-folded portion of the FPC in the photovoltaic module according to the first embodiment of the present invention.

FIG. 10 illustrates folding of the third to-be-folded portion 155 of the FPC in the photovoltaic module according to the first embodiment of the present invention.

With reference to FIG. 10, the third to-be-folded portion 155 includes a fold constituent portion 61, a fold constituent portion 62, and a fold constituent portion 63. The fold constituent portion 61 is a portion that is continued to the first connection strip portion 56. The fold constituent portion 62 is a portion that is continued to the second connection strip portion 57. The fold constituent portion 63 is a portion connects the fold constituent portion 61 and the fold constituent portion 62.

When the third to-be-folded portion 155 is to be folded, first, the fold constituent portion 63 is folded into the direction of an arrow A21 such that the fold constituent portion 63 becomes perpendicular to the fold constituent portion 61 and the fold constituent portion 62.

Next, the fold constituent portion 63 being perpendicular to the fold constituent portion 61 and the fold constituent portion 62 is folded by 180° into the direction of an arrow A22.

Accordingly, the first connection strip portion 56 and the second connection strip portion 57 are arranged linearly. The part P3 having been folded by 180° of the fold constituent portion 63 corresponds to the angle forming portion P3 shown in FIG. 8.

It should be noted that description has been given mainly on the turning portion 33L with reference to FIG. 8 to FIG. 10, but the same also applies to the other turning portions 33.

Figure 11:
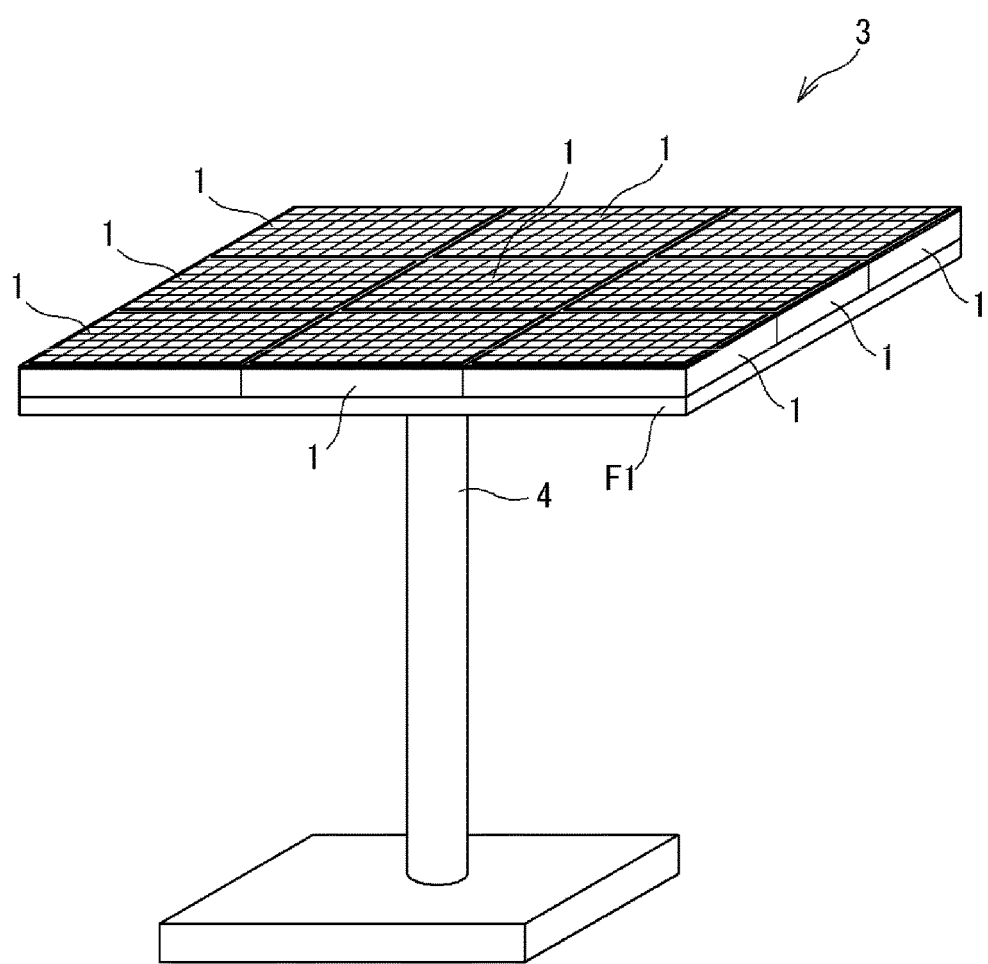
FIG. 11 shows an external view of the photovoltaic apparatus according to the first embodiment of the present invention.
Figure 12:
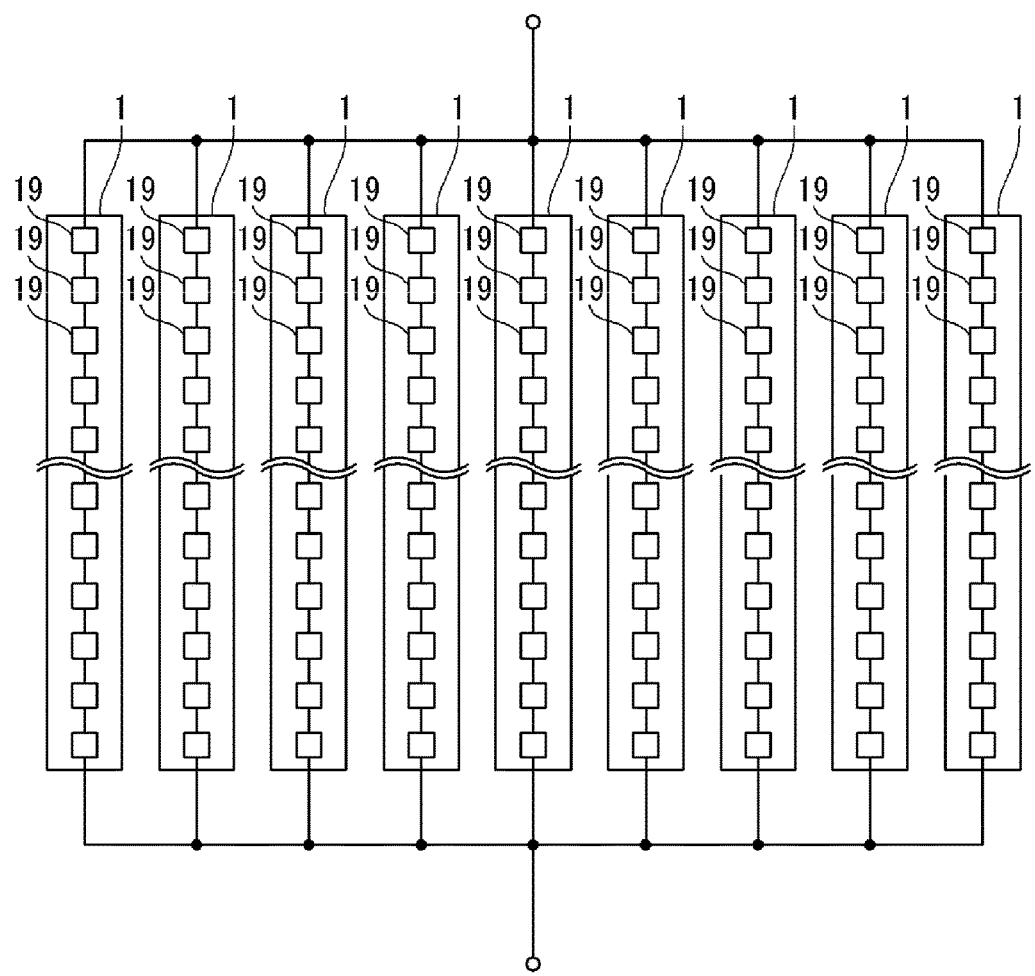
FIG. 12 shows a circuit configuration of the photovoltaic apparatus according to the first embodiment of the present invention.

FIG. 11 shows an external view of the photovoltaic apparatus according to the first embodiment of the present invention. FIG. 12 shows a circuit configuration of the photovoltaic apparatus according to the first embodiment of the present invention.

With reference to FIG. 11, a photovoltaic apparatus 3 includes a plurality of the photovoltaic modules 1, and a pedestal 4. The pedestal 4 includes a support frame F1, a solar azimuth meter C1 not shown, and a drive section M1 not shown. The solar azimuth meter C1 includes sensors for detecting the position of the sun. Each photovoltaic module 1 is fixed to the support frame F1 having a flat plate shape.

The drive section M1 recognizes the position of the sun based on signals outputted from the solar azimuth meter C1, and changes the orientation of the support frame F1 such that the light receiving surface of each photovoltaic module 1, i.e., the upper surface of each concentrating portion 25, directly faces the sun from sunrise to sunset, for example.

With reference to FIG. 12, the power generating elements 19 in each photovoltaic module 1 are connected to each other in series. In the photovoltaic apparatus 3, sets of the power generating elements 19 connected to each other in series of the respective photovoltaic modules 1 are connected to each other in parallel.

Figure 13:
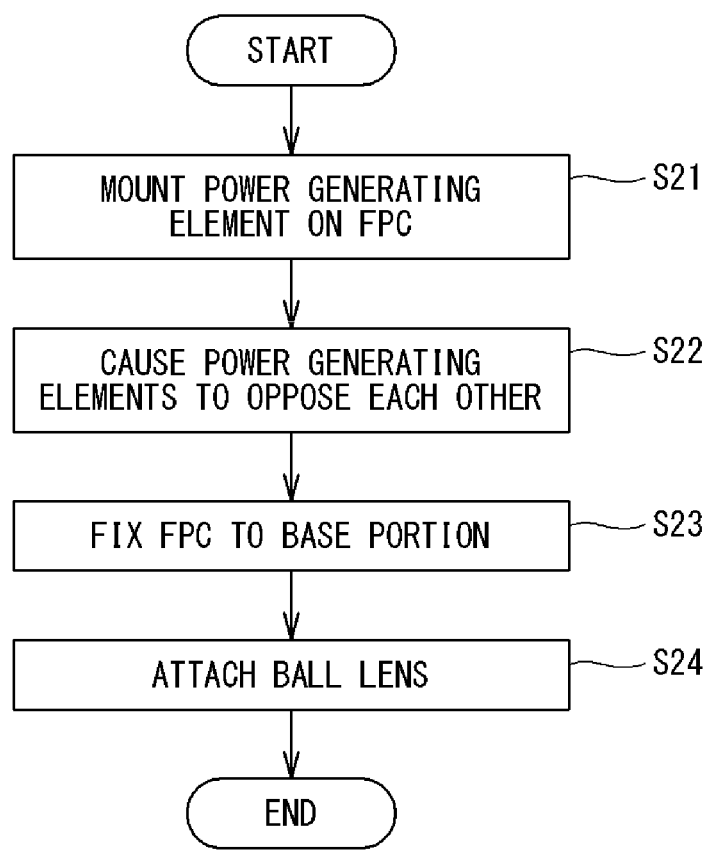
FIG. 13 is a flow chart of one example specifying a part of the procedure for producing the photovoltaic module according to the first embodiment of the present invention.

FIG. 13 is a flow chart of one example specifying a part of the procedure for producing the photovoltaic module according to the first embodiment of the present invention.

With reference to FIG. 13, first, the power generating elements 19 are mounted on each strip-shaped portion 32 of the FPC 31 (step S21). Specifically, as shown in FIG. 5, each power generating element 19, housed in the package 18, is mounted on the FPC 31.

Mounting, onto the FPC 31, of the package 18 having the power generating element 19 mounted thereon is performed in a reflow process, for example.

Next, by bending each connection portion 133 connecting the strip-shaped portions 32, the power generating elements 19 mounted on the strip-shaped portions 32 are caused to oppose each other (step S22). Specifically, each connection portion 133 is bent such that the power generating elements 19 mounted on each strip-shaped portion 32 and the power generating elements 19 mounted on another strip-shaped portion 32 adjacent to that strip-shaped portion 32 oppose with each other, and such that the distance W2 between the power generating elements 19 opposing each other is equal to the interval W3 between the power generating elements 19 adjacent to each other in each strip-shaped portion 32.

Next, the FPC 31 is fixed to the base portion 38 (step S23). Specifically, the reinforcement plate 60 adhered to the lower main surface of each strip-shaped portion 32 is adhered to the base portion 38. In addition, each turning portion 33 is adhered to the base portion 38.

The reinforcement plate 60 is adhered to the FPC 31 in a process performed before the process of step S21, for example. Specifically, for example, the reinforcement plate 60 is adhered to the strip-shaped portion 32 during production of the FPC 31.

Next, a ball lens 17 is attached to each package 18 (step S24). It should be noted that before the FPC 31 is fixed to the base portion 38, the ball lens 17 may be attached to the package 18.

[Modification]

The photovoltaic module 1 according to the first embodiment of the present invention is configured such that the FPC 31 includes ten strip-shaped portions 32, i.e., the strip-shaped portions 32A to 32J, and seven power generating portions 30 are mounted on each strip-shaped portion 32. However, the configuration is not limited thereto.

Figure 14:
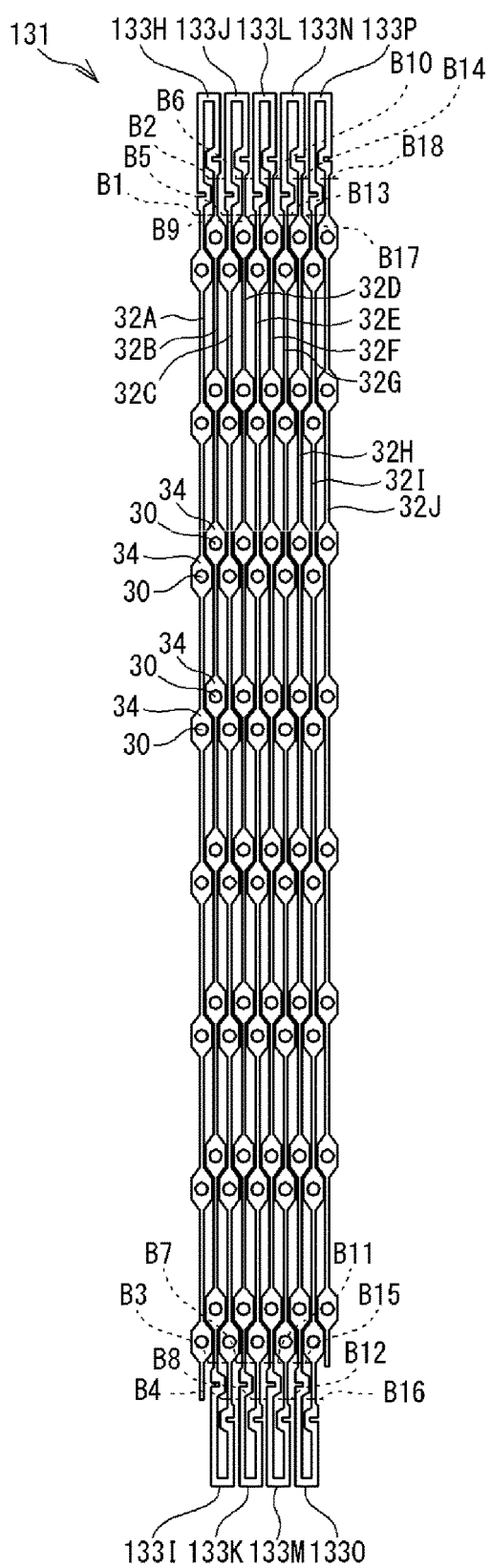
FIG. 14 shows a modification of the FPC in the photovoltaic module according to the first embodiment of the present invention.

FIG. 14 shows a modification of the FPC in the photovoltaic module according to the first embodiment of the present invention.

With reference to FIG. 14, a FPC 131 includes the strip-shaped portions 32A to 32J, and the connection portions 133H to 133P. The boundaries between the strip-shaped portions 32 and the connection portions 133 are defined as boundaries B1 to B18, respectively.

The FPC 131 includes ten strip-shaped portions 32. Eight power generating portions 30 are mounted on each strip-shaped portion 32.

The turning portions 33H to 33P are formed by the connection portions 133H to 133P being bent, respectively.

The FPC 131 is used in a case where the concentrating portion 25 shown in FIG. 2 has the Fresnel lenses 26 arranged in 8 lines by 10 rows, for example.

Figure 15:
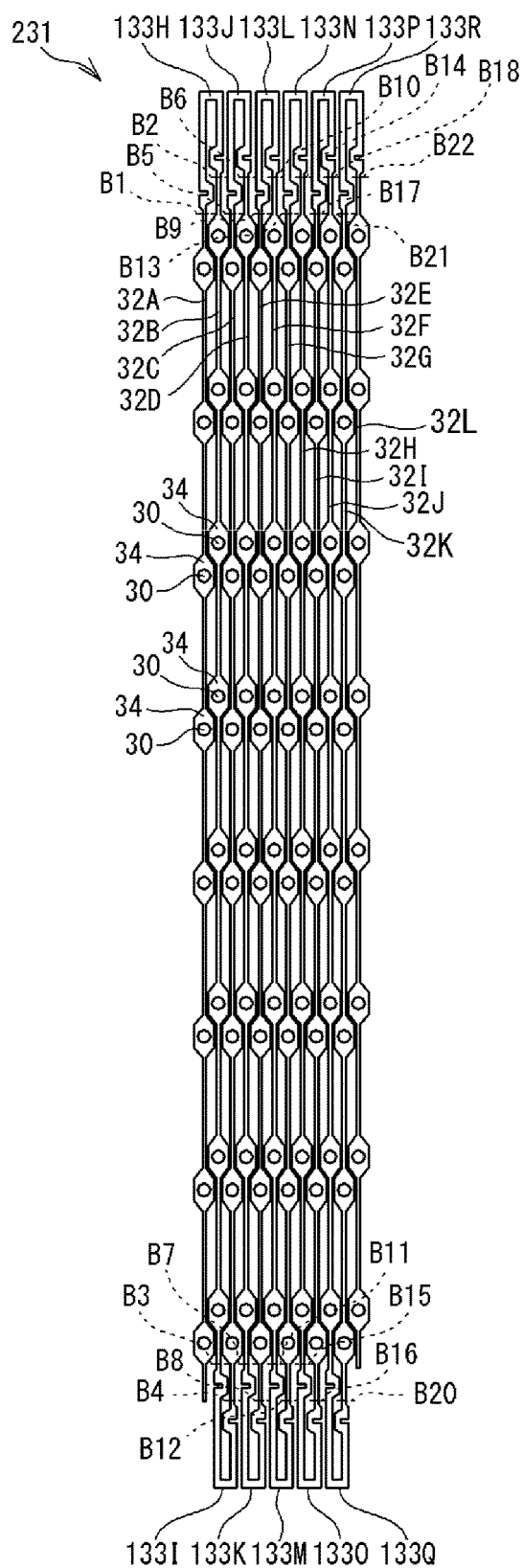
FIG. 15 shows another modification of the FPC in the photovoltaic module according to the first embodiment of the present invention.

FIG. 15 shows another modification of the FPC in the photovoltaic module according to the first embodiment of the present invention.

With reference to FIG. 15, a FPC 231 includes the strip-shaped portions 32A to 32L and the connection portions 133H to 133R. The boundaries between the strip-shaped portions 32 and the connection portions 133 are defined as boundaries B1 to B22, respectively.

The FPC 231 includes twelve strip-shaped portions 32. Eight power generating portions 30 are mounted on each strip-shaped portion 32.

The turning portions 33H to 33R are formed by the connection portions 133H to 133R being bent, respectively. The turning portions 33Q and 33R have the same configuration as that of the turning portion 33L, for example.

The FPC 231 is used in a case where the concentrating portion 25 shown in FIG. 2 has the Fresnel lenses 26 arranged in 8 lines by 12 rows, for example.

Meanwhile, in the concentrator solar cell module described in PATENT LITERATURE 1, in a case where the receiver substrate and the wiring members are connected together through soldering, welding, or the like, for example, the portion having been subjected to soldering, welding, or the like is highly likely to deteriorate over years. Thus, long-term reliability of the product may be reduced.

In addition, connection through soldering, welding, or the like may require a large man-hour, which is likely to cause increased production costs.

In contrast, in the photovoltaic module according to the first embodiment of the present invention, the FPC 31 includes the turning portions 33. The strip-shaped portions 32 of the FPC 31 located on opposite sides of each turning portion 33 are aligned so as to oppose each other.

In addition, in the photovoltaic apparatus according to the first embodiment of the present invention, the photovoltaic module 1 includes the FPC 31 and a plurality of the power generating elements 19 mounted on the FPC 31. The power generating elements 19 are connected to each other in series. The FPC 31 includes the turning portions 33. The strip-shaped portions 32 of the FPC 31 located on opposite sides of each turning portion 33 are aligned so as to oppose each other. Sets of the power generating elements 19 of the respective photovoltaic modules are connected to each other in parallel.

Thus, according to the configuration in which the strip-shaped portions 32 and the turning portions 33 which connect the strip-shaped portions 32 are integrally formed by use of a single FPC 31, the work of soldering or the like for electrically connecting the strip-shaped portions 32 to each other is not required. In addition, for example, by manufacturing the FPC 31 having a flat shape on which the strip-shaped portions 32 are densely arranged, and then by bending the connection portion 133 of each strip-shaped portion 32 in the FPC 31 to form the turning portion 33, it is possible to widen the interval between the strip-shaped portions 32. Therefore, compared with a case where the FPC 31 originally having a wide interval between the strip-shaped portions 32 is manufactured, it is possible to reduce the use area of the film being the material of the FPC 31.

Accordingly, it is possible to increase the number of FPCs 31 that can be manufactured in one production process of the flexible printed circuit, and it is possible to reduce the amount of material to be discarded.

Thus, with the photovoltaic module and the photovoltaic apparatus according to the first embodiment of the present invention, it is possible to realize high reliability and to reduce production costs.

With the photovoltaic apparatus, it is possible to obtain an output of high voltage and large current by use of the photovoltaic modules 1. Moreover, since the power generating elements 19 included in the photovoltaic module 1 are connected to each other in series, the magnitude of the current flowing in each photovoltaic module 1 can be reduced. Furthermore, for example, even in a case where one of the photovoltaic modules 1 has failed, output voltage of the photovoltaic apparatus can be maintained.

In the photovoltaic module according to the first embodiment of the present invention, the turning portions 33 are each provided to make a turn such that the power generating elements 19 mounted on the respective strip-shaped portions 32 are aligned so as to oppose each other.

According to this configuration, it is possible to arrange the power generating element 19 in an arrayed manner, and thus, for example, designing of the optical system in the photovoltaic module 1 is facilitated.

In the photovoltaic module according to the first embodiment of the present invention, each turning portion 33 is provided to make a turn such that the distance W2 between the power generating elements 19 opposing each other is equal to the interval W3 between the power generating elements 19 adjacent to each other in each strip-shaped portion 32.

According to this configuration, it is possible to densely arrange a plurality of Fresnel lenses 26 of the same shape in a square lattice pattern, for example, and to arrange the power generating elements 19 on the optical axes of the respective Fresnel lenses 26. Therefore, it is possible to increase the amount of generated power per unit area of the light receiving surface of the photovoltaic module 1.

In the photovoltaic module according to the first embodiment of the present invention, each turning portion 33 includes three folded portions, i.e., the first folded portion 53, the second folded portion 54, and the third folded portion 55. The three folded portions are linearly arranged.

According to this configuration, since the shape of the turning portion 33 is fixed, it is possible to arrange the strip-shaped portions 32 located on opposite sides of the turning portion 33 at a predetermined interval. Moreover, in a case where the FPC 31 includes a plurality of the turning portions 33 and the strip-shaped portions 32 on opposite sides of each turning portion 33, it is possible to reduce variation in the interval between the strip-shaped portions 32 located on opposite sides of each turning portion 33.

In the photovoltaic module according to the first embodiment of the present invention, the turning portion 33 has a cutout formed therein.

According to this configuration, the connection portion 133 can be bent through simple operation, and thus, the turning portion 33 can be easily formed.

With respect to the photovoltaic module according to the first embodiment of the present invention, in the FPC 31, the lengths of the parts from the folded portion at the center to the power generating elements 19 opposing each other are different from each other. For example, the length of the part from the third folded portion 55 to the power generating element 19P1 is different from the length of the part from the third folded portion 55 to the power generating element 19P2.

According to this configuration, for example, in the FPC 31 having a flat shape in a state before the turning portions 33 are formed, the parts where the power generating elements 19 are mounted in each strip-shaped portion 32 are not aligned with the parts where the power generating elements 19 are mounted in another strip-shaped portion 32 adjacent to that strip-shaped portion 32. Accordingly, for example, by reducing, in each strip-shaped portion 32, the width of the parts where the power generating elements 19 are not mounted relative to the width of the parts where the power generating elements 19 are mounted, it is possible to manufacture the FPC 31 on which the strip-shaped portions 32 are more densely arranged. Thus, it is possible to further reduce the use area of the film being the material of the FPC 31.

With respect to the photovoltaic module according to the first embodiment of the present invention, in the FPC 31, the lengths of the parts from the folded portion at the center to the folded portions on opposite sides are different from each other. For example, the length of the part from the third folded portion 55 to the first folded portion 53 is different from the length of the part from the third folded portion 55 to the second folded portion 54.

According to this configuration, for example, in the flexible printed circuit having a flat shape in a state before the turning portions 33 are formed, the parts corresponding to the folded portions on opposite sides are not aligned with each other. Thus, it is possible to manufacture the FPC 31 on which the strip-shaped portions 32 are more densely arranged. Thus, it is possible to further reduce the use area of the film being the material of the FPC 31.

In the photovoltaic module according to the first embodiment of the present invention, the conductive portion 22 of each turning portion 33 and the conductive portion 22 of its corresponding strip-shaped portion 32 are continued with each other. In addition, the insulating portion 21 of each turning portion 33 and the insulating portion 21 of its corresponding strip-shaped portion 32 are continued to each other.

According to this configuration, the conductive portion 22 is not exposed on the connection portion between the strip-shaped portion 32 and the turning portion 33. Accordingly, it is not necessary to apply resin or the like for protecting exposed parts of the conductive portion 22 from water drops and the like caused by dew condensation, for example.

In the method for producing the photovoltaic module according to the first embodiment of the present invention, first, the power generating elements 19 are mounted on each strip-shaped portion 32. Next, by bending each connection portion of the FPC 31 connecting the strip-shaped portions 32, the power generating elements 19 mounted on the strip-shaped portions 32 are aligned so as to oppose each other.

Thus, by integrally forming the strip-shaped portions 32 and the turning portions 33 which connect the strip-shaped portions 32 each other by use of a single FPC 31, the work of soldering or the like for electrically connecting the strip-shaped portions 32 to each other is not required. In addition, for example, by manufacturing the FPC 31 having a flat shape on which the strip-shaped portions 32 are densely arranged, and then by bending the connection portion 133 of each strip-shaped portion 32 in the FPC 31 to form the turning portion 33, it is possible to widen the interval between the strip-shaped portions 32. Therefore, compared with a case where the FPC 31 originally having a wide interval between the strip-shaped portions 32 is manufactured, it is possible to reduce the use area of the film being the material of the FPC 31. Accordingly, it is possible to increase the number of FPCs 31 that can be manufactured in one production process of the flexible printed circuit, and it is possible to reduce the amount of material to be discarded.

Thus, with the method for producing the photovoltaic module according to the first embodiment of the present invention, it is possible to realize high reliability and to reduce production costs.

In addition, since it is possible to arrange the power generating elements 19 in an arrayed state, designing of the optical system in the photovoltaic module 1 is facilitated, for example.

Next, another embodiment of the present invention will be described with reference to the drawings. The same or corresponding parts are denoted by the same reference characters, and description thereof is not repeated.

Second Embodiment

[Configuration and Basic Operation]

The present embodiment relates to a photovoltaic module having different shapes of the connection portion and the turning portion from those of the photovoltaic module according to the first embodiment. Other than the contents described below, the photovoltaic module according to the present embodiment is the same as the photovoltaic module according to the first embodiment.

Figure 16:
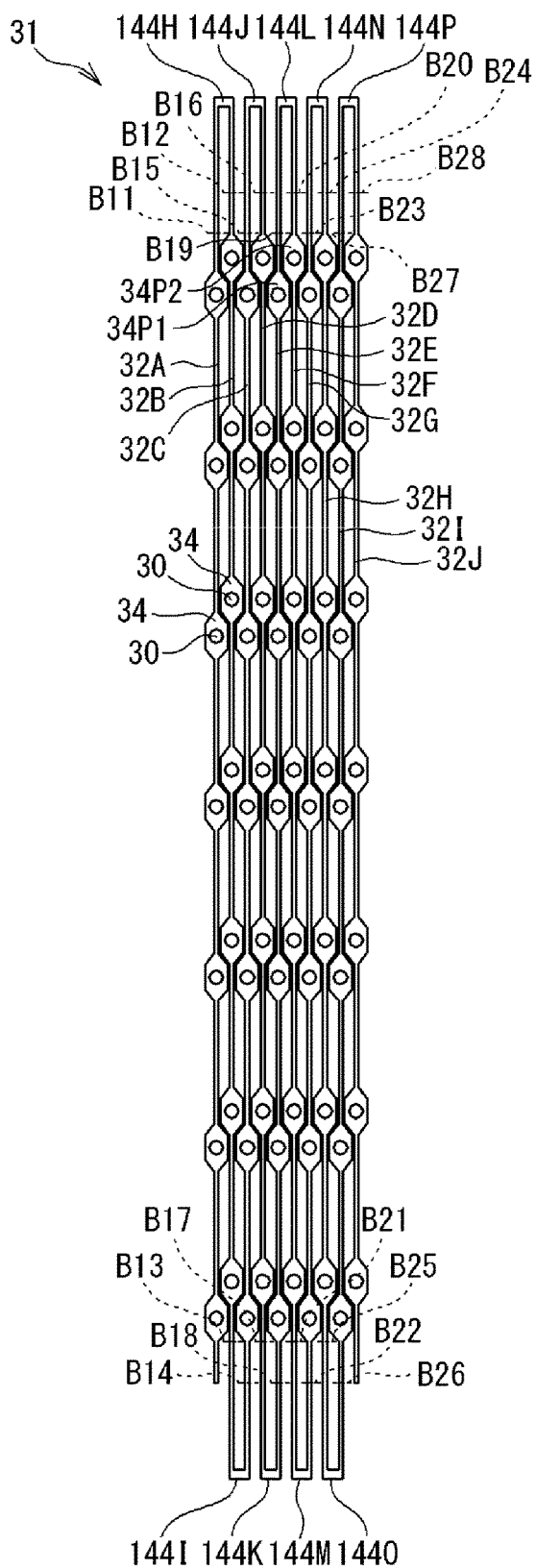
FIG. 16 shows a state before each connection portion of the FPC in the photovoltaic module according to a second embodiment of the present invention is bent.

FIG. 16 shows a state before each connection portion of the FPC in the photovoltaic module according to the second embodiment of the present invention is bent.

With reference to FIG. 16, the FPC 31 according to the second embodiment of the present invention includes the strip-shaped portions 32A to 32J, and connection portions 144H to 144P. Hereinafter, each of the connection portions 144H to 144P will also be referred to as a connection portion 144. The boundaries between the strip-shaped portions 32 and the connection portions 144 are defined as boundaries B11 to B28, respectively.

The connection portion 144 is a portion that connects two strip-shaped portions 32, in the FPC 31. More specifically, the connection portion 144H connects the strip-shaped portion 32A and the strip-shaped portion 32B. The connection portion 144I connects the strip-shaped portion 32B and the strip-shaped portion 32C. The connection portion 144J connects the strip-shaped portion 32C and the strip-shaped portion 32D. The connection portion 144K connects the strip-shaped portion 32D and the strip-shaped portion 32E. The connection portion 144L connects the strip-shaped portion 32E and the strip-shaped portion 32F. The connection portion 144M connects the strip-shaped portion 32F and the strip-shaped portion 32G The connection portion 144N connects the strip-shaped portion 32G and the strip-shaped portion 32H. The connection portion 144O connects the strip-shaped portion 32H and the strip-shaped portion 32I. The connection portion 144P connects the strip-shaped portion 32I and the strip-shaped portion 32J.

Turning portions 44H to 44P are formed by the connection portions 144H to 144P being bent, respectively.

Figure 17:
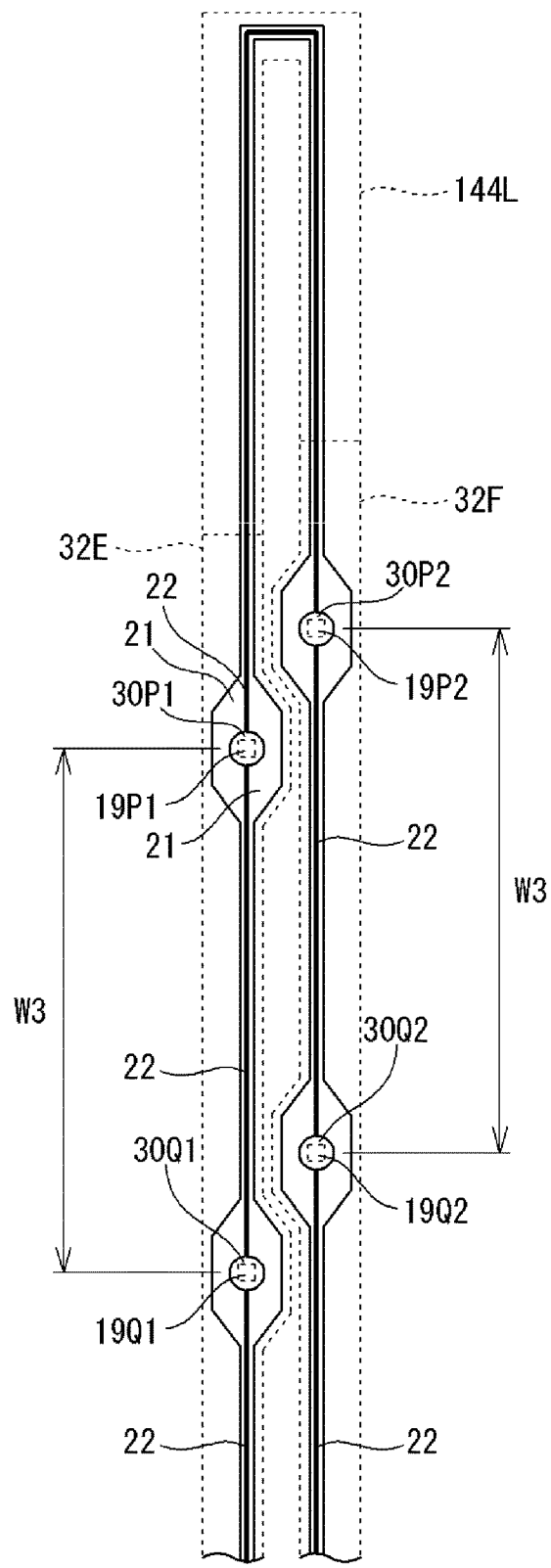
FIG. 17 shows in detail a part of the FPC shown in FIG. 16.
Figure 18:
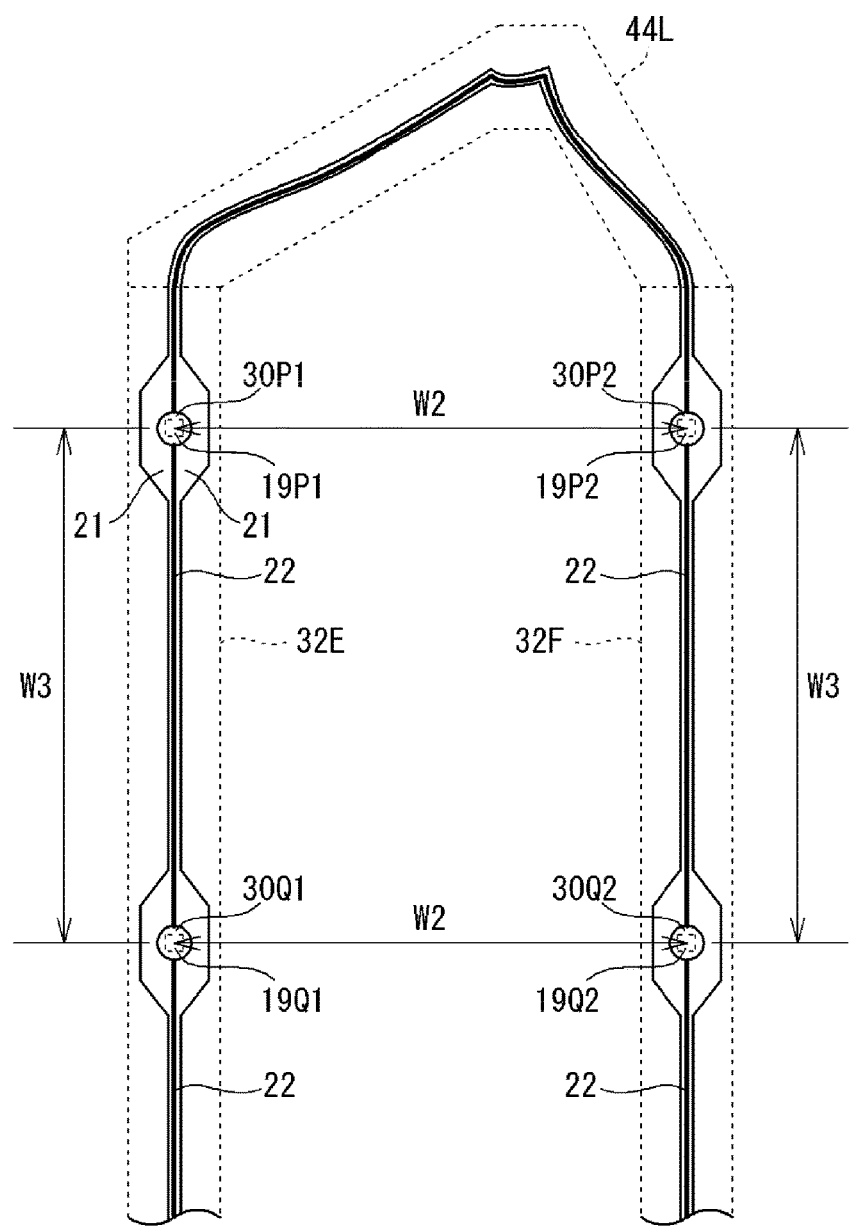
FIG. 18 shows a state after the connection portion shown in FIG. 17 has been bent.

FIG. 17 shows in detail a part of the FPC shown in FIG. 16. FIG. 18 shows a state after the connection portion shown in FIG. 17 has been bent.

With reference to FIG. 17 and FIG. 18, the turning portion 44L is a portion formed by the connection portion 144L being bent. Specifically, by the interval between the strip-shaped portion 32E and the strip-shaped portion 32F being widened, the connection portion 144L is curved to form the turning portion 44L.

The strip-shaped portion 32E and the strip-shaped portion 32F located on opposite sides of the turning portion 44L are aligned so as to oppose each other. More specifically, the strip-shaped portion 32E and the strip-shaped portion 32F oppose each other, in a state of being aligned in the widthwise direction of the strip-shaped portion 32E and the strip-shaped portion 32F, for example.

The turning portion 44L is provided to make a turn such that the power generating elements 19 mounted on the strip-shaped portion 32E and the power generating elements 19 mounted on the strip-shaped portion 32F are aligned so as to oppose each other. More specifically, for example, the power generating element 19P1 and the power generating element 19P2 oppose each other, in a state of being aligned in the widthwise direction of the strip-shaped portion 32E and the strip-shaped portion 32F.

The turning portion 44L is provided to make a turn such that the distance between each power generating element 19 mounted on the strip-shaped portion 32E and its corresponding power generating element 19 mounted on the strip-shaped portion 32F and facing that power generating element 19 on the strip-shaped portion 32E is equal to the interval between the power generating elements 19 adjacent to each other in the strip-shaped portion 32F, for example.

More specifically, for example, the turning portion 44L is provided to make a turn such that the distance W2 between the power generating element 19P1 and the power generating element 19P2 opposing each other is equal to the interval W3 between the power generating element 19P2 and the power generating element 19Q2 adjacent to each other in the strip-shaped portion 32F.

In addition, the turning portion 44L and the strip-shaped portions 32E and 32F each include the conductive portion 22, and the insulating portion 21 which covers the conductive portion 22.

The conductive portion 22 of the turning portion 44L and, for example, the conductive portion 22 of the strip-shaped portion 32E are continued to each other, and the insulating portion 21 of the turning portion 44L and, for example, the insulating portion 21 of the strip-shaped portion 32E are continued to each other.

Figure 19:
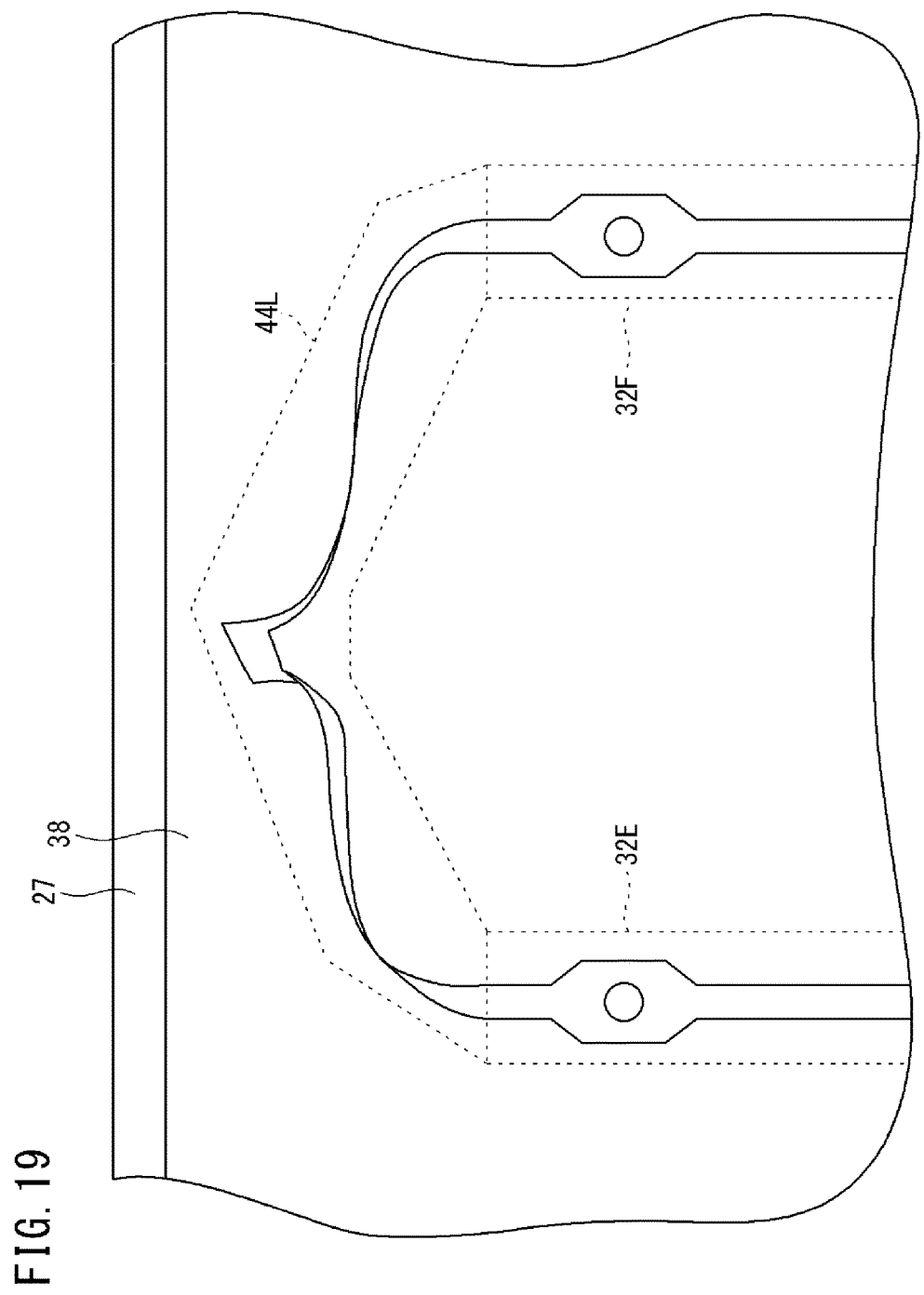
FIG. 19 shows in detail the shape of a turning portion of the FPC in the photovoltaic module according to the second embodiment of the present invention.

FIG. 19 shows in detail the shape of the turning portion of the FPC in the photovoltaic module according to the second embodiment of the present invention.

With reference to FIG. 19, by the interval between the strip-shaped portion 32E and the strip-shaped portion 32F being widened, the turning portion 44L is curved and twisted. More specifically, due to the twist, a part of the turning portion 44L being a curved portion of the FPC 31 is detached from the base portion 38.

It should be noted that, for example, in a case where the length of the connection portion 144L is small, the entirety of the turning portion 44L may be detached from the base portion 38.

The above description has been made only about the turning portion 44L with reference to FIGS. 17 to 19, and the same also applies to the other turning portions 44.

[Modification]

The photovoltaic module 1 according to the second embodiment of the present invention is configured such that the FPC 31 includes ten strip-shaped portions 32, i.e., the strip-shaped portions 32A to 32J, and seven power generating portions 30 are mounted on each strip-shaped portion 32. However, the configuration is not limited thereto.

Figure 20:
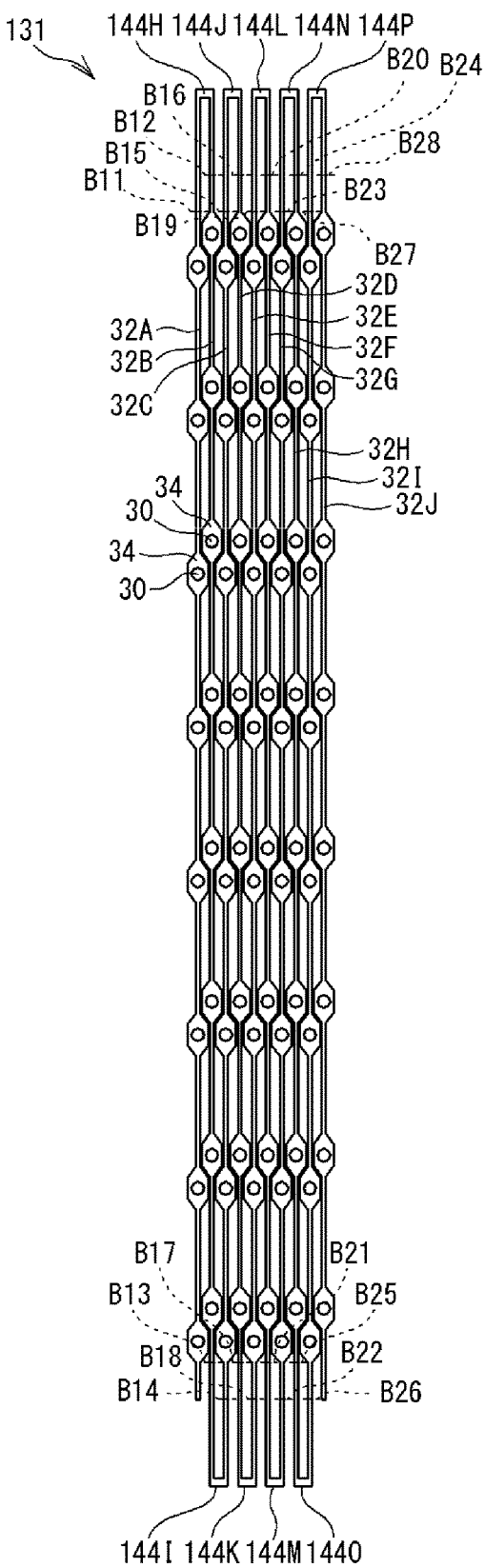
FIG. 20 shows a modification of the FPC in the photovoltaic module according to the second embodiment of the present invention.

FIG. 20 shows a modification of the FPC in the photovoltaic module according to the second embodiment of the present invention.

With reference to FIG. 20, the FPC 131 includes the strip-shaped portions 32A to 32J and the connection portions 144H to 144P. The boundaries between the strip-shaped portions 32 and the connection portions 144 are defined as boundaries B11 to B28, respectively.

The FPC 131 includes ten strip-shaped portions 32. Eight power generating portions 30 are mounted on each strip-shaped portion 32.

The turning portions 44H to 44P are formed by the connection portions 144H to 144P being bent, respectively.

The FPC 131 is used in a case where the concentrating portion 25 shown in FIG. 2 has the Fresnel lenses 26 arranged in 8 lines by 10 rows, for example.

Figure 21:
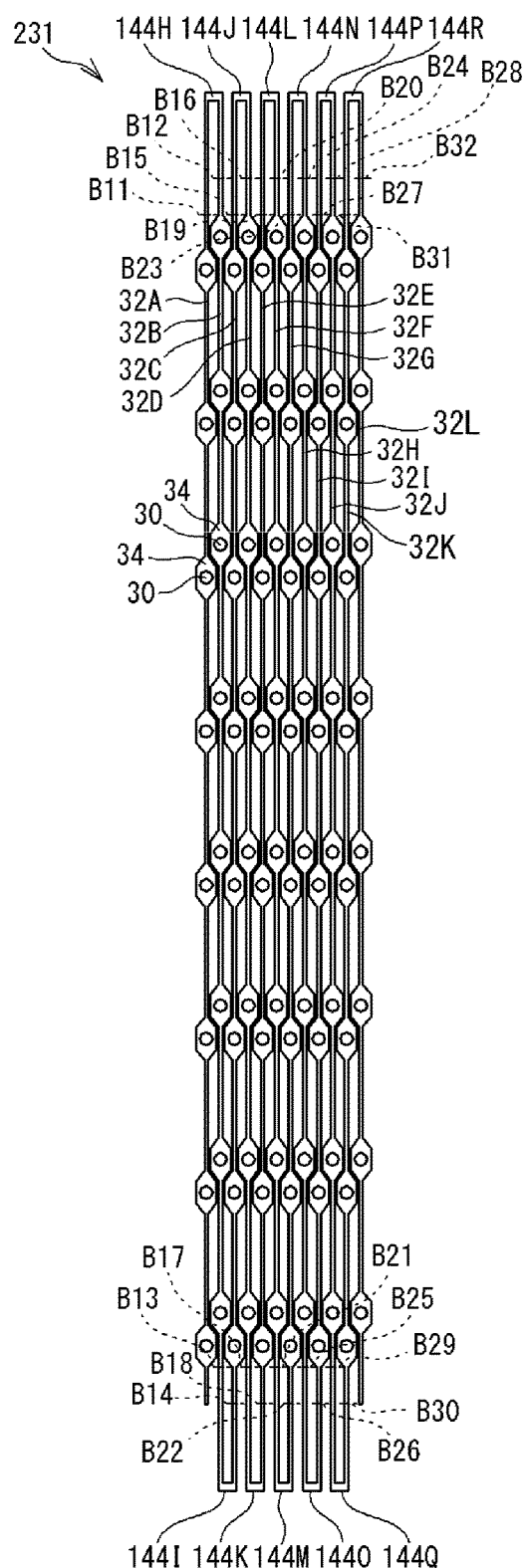
FIG. 21 shows another modification of the FPC in the photovoltaic module according to the second embodiment of the present invention.

FIG. 21 shows another modification of the FPC in the photovoltaic module according to the second embodiment of the present invention.

With reference to FIG. 21, the FPC 231 includes the strip-shaped portions 32A to 32L and the connection portions 144H to 144R. The boundaries between the strip-shaped portions 32 and the connection portions 144 are defined as boundaries B11 to B32, respectively.

The FPC 231 includes twelve strip-shaped portions 32. Eight power generating portions 30 are mounted on each strip-shaped portion 32.

The turning portions 44H to 44R are formed by the connection portions 144H to 144R being bent, respectively. The turning portions 44Q and 44R each have the same configuration as that of the turning portion 44L, for example.

The FPC 231 is used in a case where the concentrating portion 25 shown in FIG. 2 has the Fresnel lenses 26 arranged in 8 lines by 12 rows, for example.

As described as above, the FPC 31 includes a curved portion as the turning portion 44, wherein part or entirety of the curved portion is detached from the base portion 38.

Thus, according to the configuration in which the turning portion 44 is not formed by folding, it is possible to reduce man-hour in production of the photovoltaic module 1. In addition, for example, the turning portion 44 is detached from the base portion 38 which is made of metal and on which the strip-shaped portion 32 is fixed, whereby it is possible to suppress generation of discharge between the conductive portion 22 of the turning portion 44 and the base portion 38.

The other configurations and operation are the same as those of the photovoltaic module according to the first embodiment, and thus, detailed description is not repeated.

It should be noted that the embodiments above are merely illustrative and not restrictive in all aspects. The scope of the present invention is defined by the scope of the claims, and is intended to include meaning equivalent to the scope of the claims and all modifications within the scope.

The above description includes the features in the additional notes below.

[Additional Note 1]

A photovoltaic module including:

a flexible printed circuit; and a plurality of power generating elements mounted on the flexible printed circuit, wherein the flexible printed circuit includes a turning portion, and a connection portion for strip-shaped portions of the flexible printed circuit which are located on opposite sides of the turning portion is bent along the extending surface of the strip-shaped portions, whereby the strip-shaped portions are aligned so as to oppose each other, not with the turning portion interposed therebetween but with space interposed therebetween, in a state of being aligned in the widthwise direction of the strip-shaped portions on the extending surface.

[Additional Note 2]

A photovoltaic apparatus including:
a plurality of photovoltaic modules, wherein
each of the photovoltaic modules includes:
a flexible printed circuit; and
a plurality of power generating elements mounted on the flexible printed circuit,
the power generating elements are connected to each other in series,
the flexible printed circuit includes a turning portion,
a connection portion for strip-shaped portions of the flexible printed circuit which are located on opposite sides of the turning portion is bent along the extending surface of the strip-shaped portions, whereby the strip-shaped portions are aligned so as to oppose each other, not with the turning portion interposed therebetween but with space interposed therebetween, in a state of being aligned in the widthwise direction of the strip-shaped portions on the extending surface, and
sets of the power generating elements of the respective photovoltaic modules are connected to each other in parallel.

REFERENCE SIGNS LIST 1 photovoltaic module
2 housing
3 photovoltaic apparatus
4 pedestal
17 ball lens
18 package
19, 19P1, 19P2, 19Q1, 19Q2 power generating element
20, 20A, 20B package electrode
21 insulating portion
22, 22A, 22B conductive portion
25 concentrating portion
26 Fresnel lens
27 wall portion
30, 30P1, 30P2, 30Q1, 30Q2, 30R1, 30R2 power generating portion
31, 131, 231 FPC
32, 32A to 32L strip-shaped portion
33, 33H to 33R, 44, 44H to 44R turning portion
34 element-mounted portion
38 base portion
39 lead wire
42, 42A, 42B element electrode
53 first folded portion
54 second folded portion
55 third folded portion
56 first connection strip portion
57 second connection strip portion
60 reinforcement plate
61, 62, 63, 67, 68, 69 fold constituent portion
65 cutout
133, 133H to 133R, 144, 144H to 144R connection portion
153 first to-be-folded portion
154 second to-be-folded portion
155 third to-be-folded portion
B1 to B32 boundary
SA, SB solder portion
Ta1, Tb1 first end
Ta2, Tb2 second end

The invention claimed is:

1. A photovoltaic module comprising:
a flexible printed circuit arranged on a base portion of a housing; and
a plurality of power generating elements mounted on the flexible printed circuit, wherein the flexible printed circuit includes:
a turning portion which makes a change of an extending direction of the flexible printed circuit on the base portion, and
strip-shaped portions which are located on opposite sides of the turning portion and aligned so as to oppose each other, wherein
a direction perpendicular to the extending direction of the flexible printed circuit along the base portion is defined as a width of the flexible printed circuit, each of the strip-shaped portions has wide portions on which the power generating elements are mounted and narrow portions between the wide portions adjacent to each other, and a width of each of the turning portion and the narrow portions is narrower than a width of the wide portions, and
the width of each of the turning portion, the narrow portions, and the wide portions is equal to the width of the flexible printed circuit at the respective portion.

2. The photovoltaic module according to claim 1, wherein the turning portion is provided to make a turn such that the power generating elements mounted on the respective strip-shaped portions are aligned so as to oppose each other.

3. The photovoltaic module according to claim 2, wherein the turning portion is provided to make a turn such that a distance between the power generating elements opposing each other is equal to an interval between the power generating elements adjacent to each other in each strip-shaped portion.

4. The photovoltaic module according to claim 1, wherein the turning portion includes three folded portions, and the three folded portions are linearly arranged.

5. The photovoltaic module according to claim 1, wherein the turning portion has a cutout formed therein.

6. The photovoltaic module according to claim 1, wherein the turning portion is provided to make a turn such that the power generating elements mounted on the respective strip-shaped portions are aligned so as to oppose each other,
the turning portion includes three folded portions,
the three folded portions are linearly arranged, and
in the flexible printed circuit, lengths of parts from a middle one of the three folded portions to the power generating elements opposing each other are different from each other.

7. The photovoltaic module according to claim 1, wherein the turning portion includes three folded portions, and
in the flexible printed circuit, lengths of parts from a middle one of the three folded portions to the folded portions on opposite sides are different from each other.

8. The photovoltaic module according to claim 1, wherein the flexible printed circuit includes a curved portion as the turning portion, a part or entirety of the curved portion being detached from the base portion.

9. The photovoltaic module according to claim 1, wherein the turning portion and the strip-shaped portions each include a conductive portion, and an insulating portion which covers the conductive portion, the conductive portion of the turning portion and the conductive portion of each strip-shaped portion are continued to each other, and the insulating portion of the turning portion and the insulating portion of each strip-shaped portion are continued to each other.

10. A photovoltaic apparatus comprising:

a plurality of photovoltaic modules, wherein each of the photovoltaic modules includes:

- a flexible printed circuit arranged on a base portion of a housing; and a plurality of power generating elements mounted on the flexible printed circuit, the power generating elements being connected to each other in series, the flexible printed circuit includes:

- a turning portion which makes a change of an extending direction of the flexible printed circuit on the base portion, and strip-shaped portions which are located on opposite sides of the turning portion and aligned so as to oppose each other, wherein a direction perpendicular to the extending direction of the flexible printed circuit along the base portion is defined as a width of the flexible printed circuit each of the strip-shaped portions has wide portions on which the power generating elements are mounted and narrow portions between the wide portions adjacent to each other, and a width of the turning portion and the narrow portions is narrower than a width of the wide portions, the width of each of the turning portion, the narrow portions, and the wide portions is equal to the width of the flexible printed circuit at the respective portion, and sets of the power generating elements of the respective photovoltaic modules are connected to each other in parallel.

* * * * *